(12) United States Patent
Lee et al.

(10) Patent No.: US 11,961,560 B2
(45) Date of Patent: Apr. 16, 2024

(54) INTEGRATED CIRCUIT DEVICES

(71) Applicant: Samsung Electronics Co., Ltd., Suwon-si (KR)

(72) Inventors: Myunghun Lee, Seongnam-si (KR); Sangwan Nam, Hwaseong-si (KR); Taemin Ok, Cheonan-si (KR)

(73) Assignee: Samsung Electronics Co., Ltd. (KR)

(*) Notice: Subject to any disclaimer, the term of this patent is extended or adjusted under 35 U.S.C. 154(b) by 759 days.

(21) Appl. No.: 17/096,245

(22) Filed: Nov. 12, 2020

(65) Prior Publication Data

US 2021/0343342 A1  Nov. 4, 2021

(30) Foreign Application Priority Data

Apr. 29, 2020 (KR) .................. 10-2020-0052894

(51) Int. Cl.
| | |
|---|---|
| H01L 23/528 | (2006.01) |
| G11C 16/04 | (2006.01) |
| G11C 16/26 | (2006.01) |
| H10B 41/27 | (2023.01) |
| H10B 41/40 | (2023.01) |
| H10B 41/50 | (2023.01) |
| H10B 43/10 | (2023.01) |
| H10B 43/20 | (2023.01) |
| H10B 43/27 | (2023.01) |
| H10B 43/40 | (2023.01) |
| H10B 43/50 | (2023.01) |

(52) U.S. Cl.
CPC .......... *G11C 16/0483* (2013.01); *G11C 16/26* (2013.01); *H01L 23/528* (2013.01); *H10B 41/27* (2023.02); *H10B 41/40* (2023.02); *H10B 41/50* (2023.02); *H10B 43/10* (2023.02); *H10B 43/20* (2023.02); *H10B 43/27* (2023.02); *H10B 43/40* (2023.02); *H10B 43/50* (2023.02)

(58) Field of Classification Search
CPC .................... H10B 41/00–70; H10B 43/00–50
See application file for complete search history.

(56) References Cited

U.S. PATENT DOCUMENTS

| | | |
|---|---|---|
| 9,853,047 B2 | 12/2017 | Choi |
| 9,953,993 B2 | 4/2018 | Utsumi et al. |
| 9,978,756 B2 | 5/2018 | Kim et al. |
| 10,014,058 B2 | 7/2018 | Lee |
| 2010/0090286 A1* | 4/2010 | Lee ........................ H10B 43/20 257/E27.081 |
| 2019/0115357 A1 | 4/2019 | Oh et al. |
| 2019/0139968 A1 | 5/2019 | Shim et al. |
| 2019/0157284 A1 | 5/2019 | Park et al. |

* cited by examiner

*Primary Examiner* — Steven M Christopher
*Assistant Examiner* — Tyler J Wiegand
(74) *Attorney, Agent, or Firm* — Myers Bigel, P.A.

(57) ABSTRACT

An integrated circuit device includes a peripheral circuit structure including a lower substrate, an arc protection diode in the lower substrate, and a common source line driver connected to the arc protection diode, a conductive plate on the peripheral circuit structure, a cell array structure overlapping the peripheral circuit structure in a vertical direction with the conductive plate therebetween, and a first wiring structure connected between the arc protection diode and the conductive plate.

13 Claims, 27 Drawing Sheets

INTEGRATED CIRCUIT DEVICES

CROSS-REFERENCE TO RELATED APPLICATION

This application claims the benefit of Korean Patent Application No. 10-2020-0052894, filed on Apr. 29, 2020, in the Korean Intellectual Property Office, the disclosure of which is incorporated herein in its entirety by reference.

BACKGROUND

The inventive concepts relate to integrated circuit devices, and more particularly, to integrated circuit devices including a non-volatile memory device having a cell over periphery (COP) structure.

With the multi-functionalization of information communication devices, the integrated circuit devices including a memory device are becoming more complex and more highly integrated. In addition, the size of a memory cell are gradually being reduced, and the operation circuits and wiring structures to be included in the memory device for the operation and electrical connection of the memory device are also becoming complicated. Accordingly, there is a need for the integrated circuit device including the memory device having a structure with excellent electrical characteristics while having improved integration.

SUMMARY

The inventive concepts provide integrated circuit devices having a structure capable of providing excellent electrical characteristics in a highly integrated memory device.

According to an aspect of the inventive concepts, there is provided an integrated circuit device including a peripheral circuit structure including a lower substrate, an arc protection diode in the lower substrate, and a common source line driver connected to the arc protection diode; a conductive plate on the peripheral circuit structure; a cell array structure overlapping the peripheral circuit structure in a vertical direction with the conductive plate therebetween; and a first wiring structure connected between the arc protection diode and the conductive plate.

According to an aspect of the inventive concepts, there is provided an integrated circuit device including a peripheral circuit structure including a lower substrate, an arc protection diode in the lower substrate, and a common source line driver that includes a transistor connected to the arc protection diode; a cell array structure that overlaps the peripheral circuit structure in a vertical direction and includes a memory stack comprising a plurality of gate lines stacked in the vertical direction and a channel structure penetrating the plurality of gate lines in the vertical direction; a conductive plate interposed between the peripheral circuit structure and the cell array structure; and a first wiring structure connected between the arc protection diode and the conductive plate.

According to an aspect of the inventive concepts, there is provided an integrated circuit device including a peripheral circuit region comprising a peripheral circuit structure, wherein the peripheral circuit structure comprises a lower substrate, an arc protection diode in the lower substrate, and a common source line driver connected to the arc protection diode; a cell region comprising a cell array structure overlapping the peripheral circuit structure in a vertical direction, wherein the cell region is vertically connected to the peripheral circuit region; and a conductive plate comprising a conductive region, wherein the conductive plate is between the peripheral circuit structure and the cell array structure, wherein the common source line driver comprises a transistor that comprises a gate, a source in the lower substrate adjacent a first side of the gate, and a drain in the lower substrate adjacent a second side of the gate and connected to the arc protection diode, wherein the cell array structure comprises a plurality of gate lines stacked in the vertical direction on the conductive plate and a channel structure penetrating the plurality of gate lines in the vertical direction, and wherein the peripheral circuit structure further comprises a first wiring structure connected between the arc protection diode and the conductive plate.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
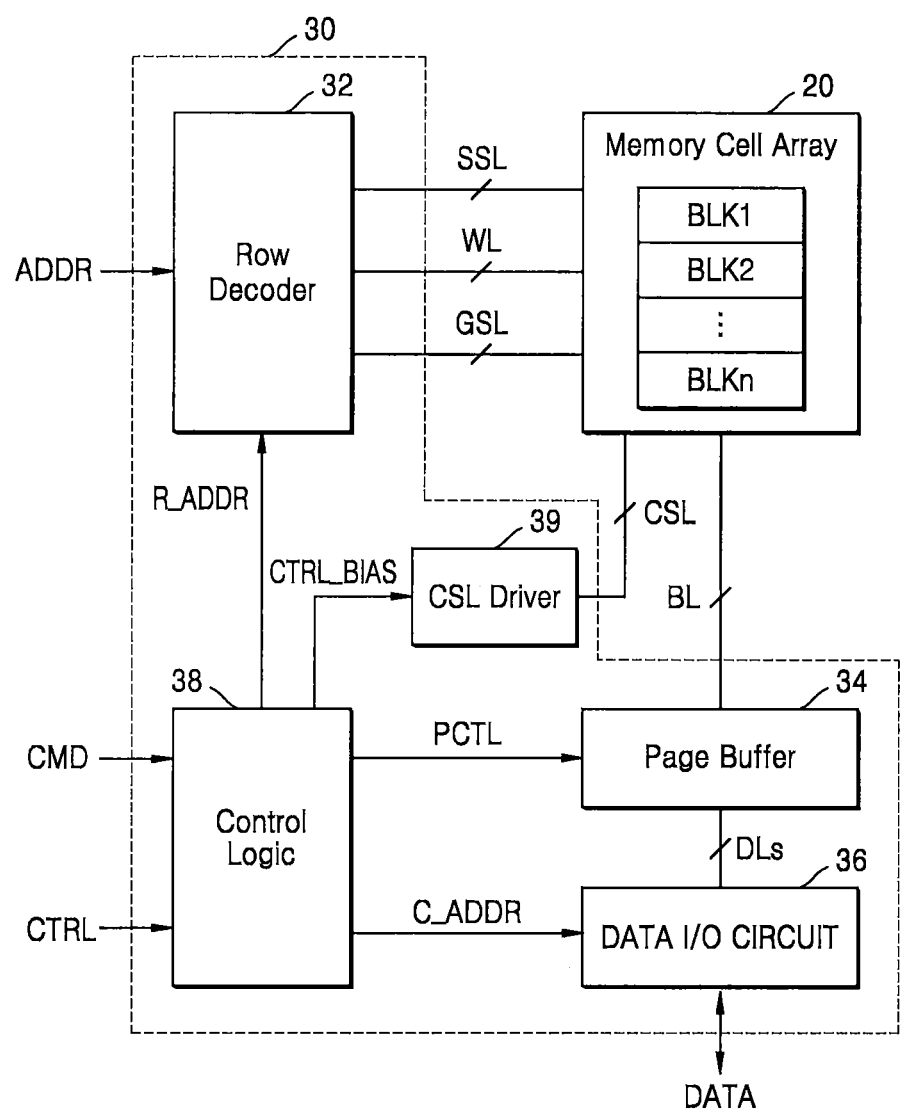
FIG. 1 is a block diagram of an integrated circuit device according to embodiments of the inventive concepts.

Hereinafter, embodiments of the inventive concepts will be described in detail with reference to the accompanying drawings. The same reference numerals are used for the same components throughout the drawings, and redundant descriptions thereof are omitted.

FIG. 1 is a block diagram of an integrated circuit device 10 according to embodiments of the inventive concepts.

Referring to FIG. 1, the integrated circuit device 10 may include a memory cell array 20 and a peripheral circuit 30. The memory cell array 20 may include a plurality of memory cell blocks BLK1, BLK2, BLKn. Each of the plurality of memory cell blocks BLK1, BLK2, . . . , and BLKn may include a plurality of memory cells. The plurality of memory cell blocks BLK1, BLK2, and BLKn may be connected to the peripheral circuit 30 through bit lines BL, word lines WL, string selection lines SSL, a common source line (CSL), and ground selection lines GSL.

The peripheral circuit 30 may include a row decoder 32, a page buffer 34, a data input/output circuit 36, a control logic 38, and a CSL driver 39. Although not shown in FIG. 1, the peripheral circuit 30 may further include various circuits such as a voltage generation circuit that generates various voltages to be required for the operation of the integrated circuit device 10, an error correction circuit for correcting an error of data read from the memory cell array 20, and/or an input/output interface.

The memory cell array 20 may be connected to the page buffer 34 through the bit lines BL and may be connected to the row decoder 32 through the word lines WL, the string selection lines SSL, and the ground selection lines GSL. In the memory cell array 20, the plurality of memory cells included in each of the plurality of memory cell blocks BLK1, BLK2, . . . , and BLKn may be flash memory cells. The memory cell array 20 may include a three-dimensional memory cell array. The three-dimensional memory cell array may include a plurality of NAND strings and the plurality of NAND strings may include a plurality of memory cells connected to a plurality of word lines WL vertically stacked, respectively.

The peripheral circuit 30 may receive an address ADDR, a command CMD, and a control signal CTRL from the outside of the integrated circuit device 10 and may transmit and receive data DATA to and from a device outside the integrated circuit device 10.

The row decoder 32 may select at least one of the plurality of memory cell blocks BLK1, BLK2, . . . , and BLKn in response to the address ADDR from the outside and may select a word line WL, a string selection line SSL, and a ground selection line GSL of the selected memory cell block. The row decoder 32 may transmit a voltage for performing a memory operation to the word line WL of the selected memory cell block.

The page buffer 34 may be connected to the memory cell array 20 through the bit lines BL. The page buffer 34 may operate as a write driver during a program operation and may apply a voltage in accordance with the data DATA to be stored in the memory cell array 20 to the bit lines BL and may operate as a sense amplifier during a read operation and may sense the data DATA stored in the memory cell array 20. The page buffer 34 may operate in accordance with a control signal PCTL provided by the control logic 38.

The data input and output circuit 36 may be connected to the page buffer 34 through data lines DLs. The data input and output circuit 36 may receive the data DATA from a memory controller (not shown) during the program operation and may provide program data DATA to the page buffer 34 based on a column address C_ADDR provided by the control logic 38. The data input and output circuit 36 may provide read data DATA stored in the page buffer 34 to the memory controller based on the column address C_ADDR provided by the control logic 38 during a read operation.

The data input and output circuit 36 may transmit an input address or command to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and may provide the column address C_ADDR to the data input and output circuit 36. The control logic 38 may generate various internal control signals used in the integrated circuit device 10 in response to the control signal CTRL. For example, the control logic 38 may adjust a level of a voltage provided to the word lines WL and the bit lines BL while a memory operation such as the program operation or an erase operation is performed.

The common source line driver 39 may be connected to the memory cell array 20 through the common source line CSL. The common source line driver 39 may apply a common source voltage (e.g., a power supply voltage) or a ground voltage to the common source line CSL based on the control of the control logic 38. In example embodiments, the common source line driver 39 may be arranged under the memory cell array 20. The common source line driver 39 may be arranged to vertically overlap at least a portion of the memory cell array 20. The common source line driver 39 may output a common source voltage to a conductive plate that supports the memory cell array 20, for example, a conductive plate 110 illustrated in FIG. 5B, through a wiring structure arranged under the memory cell array 20, for example, a first wiring structure P81 illustrated in FIG. 5B or a first wiring structure P280 illustrated in FIG. 6.

Figure 2:
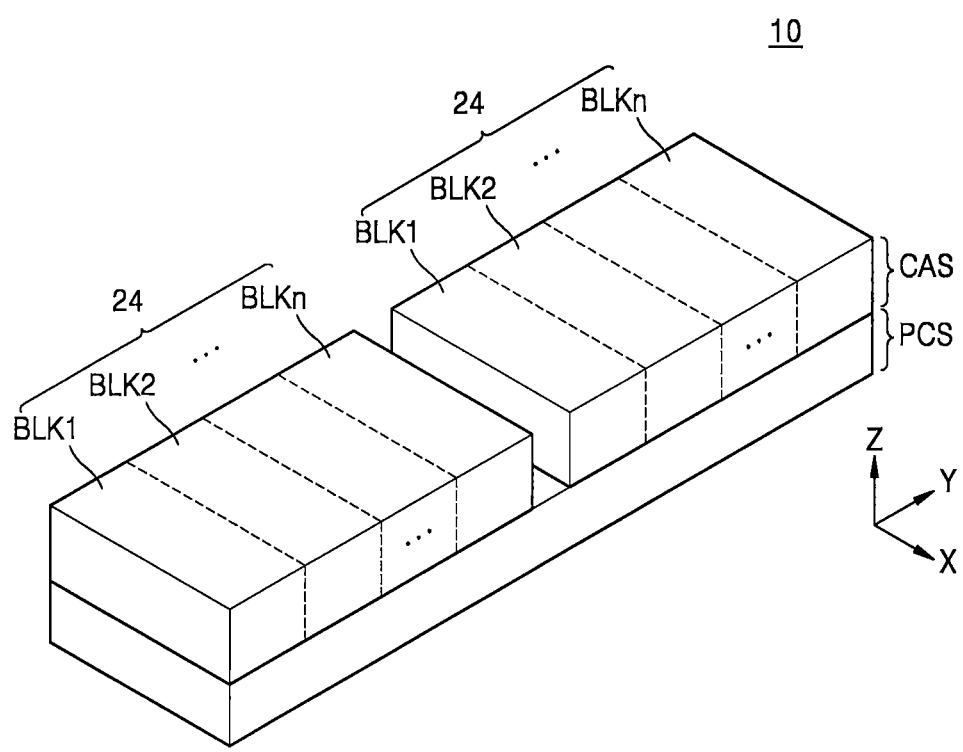
FIG. 2 is a perspective view of an integrated circuit device according to embodiments of the inventive concepts.

FIG. 2 is a schematic perspective view of the integrated circuit device 10 according to embodiments of the inventive concepts.

Referring to FIG. 2, the integrated circuit device 10 may include a cell array structure CAS and a peripheral circuit structure PCS that overlap each other in a vertical direction (e.g., a Z direction). It will be understood that "an element A vertically overlapping an element B" (or similar language) as used herein means that at least one vertical line exists that intersects both the elements A and B. The cell array structure CAS may include the memory cell array 20 described with reference to FIG. 1. The peripheral circuit structure PCS may include the peripheral circuit 30 described with reference to FIG. 1.

The cell array structure CAS may include a plurality of tiles 24. Each of the plurality of tiles 24 may include the plurality of memory cell blocks BLK1, BLK2, . . . , and BLKn. Each of the plurality of memory cell blocks BLK1, BLK2, . . . , and BLKn may include three-dimensionally arranged memory cells.

In example embodiments, two tiles 24 may form one mat, but the inventive concepts are not limited thereto. The memory cell array 20 described with reference to FIG. 1 may include a plurality of mats, for example, four mats, but the inventive concepts are not limited thereto.

Figure 3:
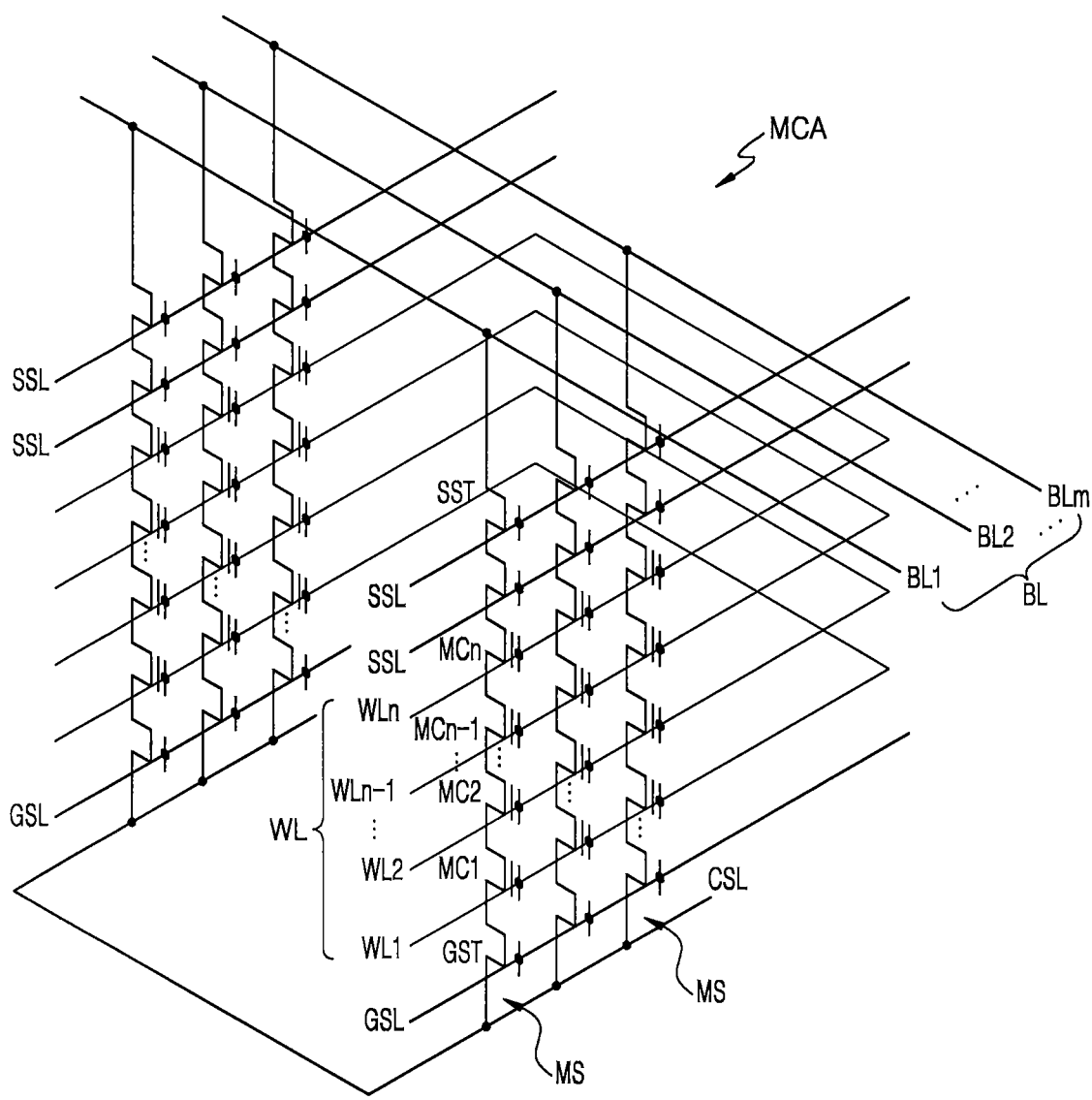
FIG. 3 is an equivalent circuit diagram of a memory cell array of an integrated circuit device according to embodiments of the inventive concepts.

FIG. 3 is an equivalent circuit diagram of a memory cell array MCA of an integrated circuit device according to embodiments of the inventive concepts. In FIG. 3, an equivalent circuit diagram of a vertical NAND flash memory device with a vertical channel structure is illustrated. Each of the plurality of memory cell blocks BLK1, BLK2, . . . , and BLKn illustrated in FIG. 2 may include the memory cell array MCA with the circuit configuration illustrated in FIG. 3.

Referring to FIG. 3, the memory cell array MCA may include a plurality of memory cell strings MS. The memory cell array MCA may include a plurality of bit lines BL (BL1, BL2, . . . , and BLm), a plurality of word lines WL (WL1, WL2, WLn−1, and WLn), at least one string selection line SSL, at least one ground selection line GSL, and a common source line CSL. A plurality of memory cell strings MS may be formed between the plurality of bit lines BL and the common source line CSL. In FIG. 3, it is illustrated that each of the plurality of memory cell strings MS includes two string selection lines SSL, but is not limited thereto. For example, each of the plurality of memory cell strings MS may include one string selection line SSL.

Each of the plurality of memory cell strings MS may include a string selection transistor SST, a ground selection transistor GST, and a plurality of memory cell transistors MC1, MC2, . . . , MCn−1, and MCn. Drain regions of the string select transistors SST may be connected to the bit line BL, and source regions of the ground select transistors GST may be connected to the common source line CSL. Source regions of the plurality of ground selection transistors GST may be commonly connected to the common source line CSL.

The string selection transistors SST may be connected to the string selection lines SSL and the ground selection transistors GST may be connected to the ground selection lines GSL. The plurality of memory cell transistors MC1, MC2, MCn−1, and MCn may be respectively connected to the plurality of word lines WL.

Figure 4:
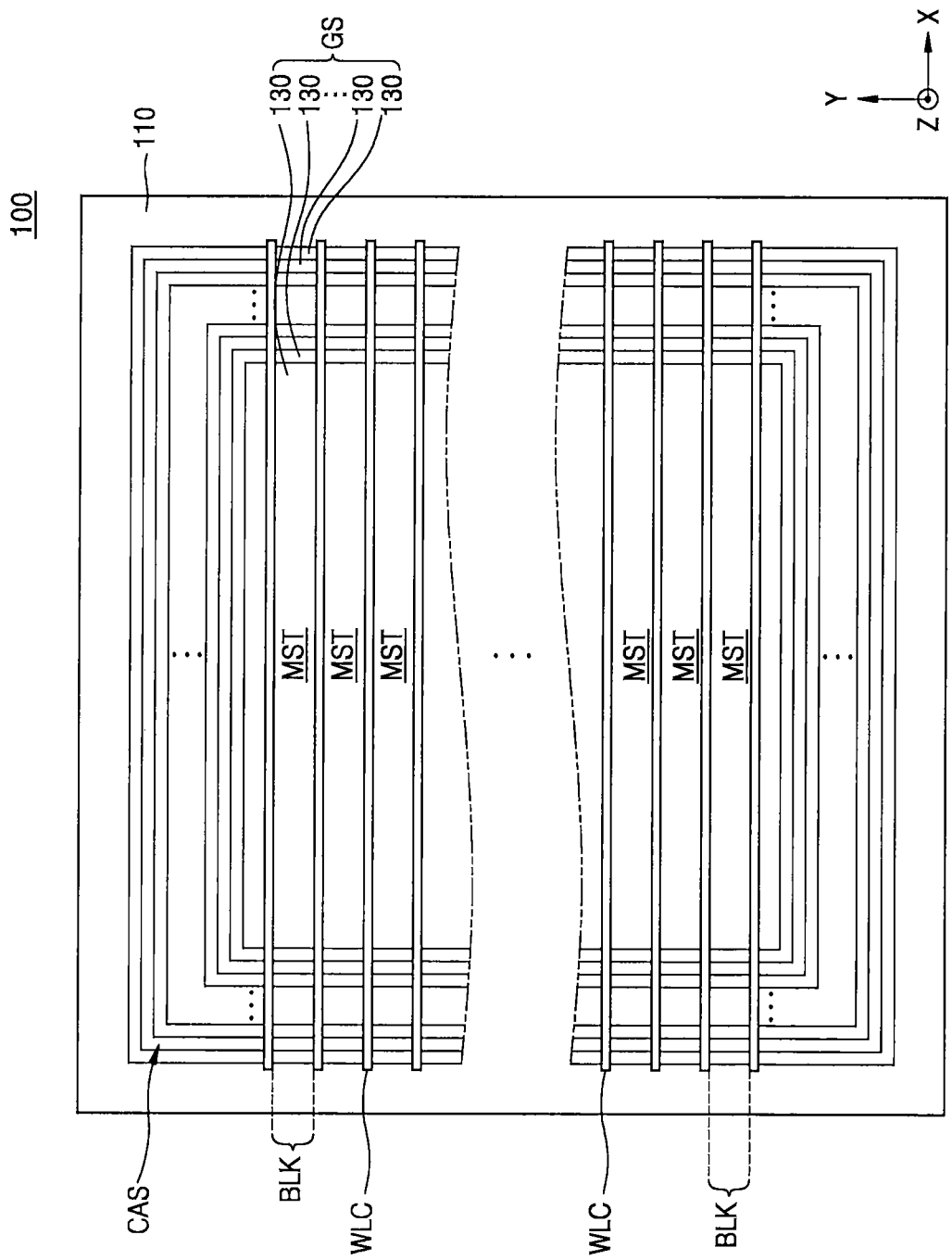
FIG. 4 is a schematic plan view of an integrated circuit device according to embodiments of the inventive concepts.

FIG. 4 is a schematic plan view of an integrated circuit device 100 according to embodiments of the inventive concepts.

Referring to FIG. 4, the integrated circuit device 100 may include a cell array structure CAS arranged on a conductive plate 110. The conductive plate 110 and the cell array structure CAS may form the memory cell array 20 of the integrated circuit device 10 illustrated in FIG. 1. The conductive plate 110 may perform a function of the common source line CSL illustrated in FIG. 3. The conductive plate 110 may support the cell array structure CAS. In this specification, the term "a conductive plate" may be referred to as "a plate CSL," and "the conductive plate" may mean the same as "the plate CSL."

The cell array structure CAS may include a plurality of memory cell blocks BLK. The plurality of memory cell blocks BLK constituting one tile 24 in the cell array structure CAS may include the plurality of memory cell blocks BLK1, BLK2, . . . , and BLKn illustrated in FIG. 2. In example embodiments, the conductive plate 110 may provide a path through which a common source voltage may be transmitted to the cell array structure CAS.

The integrated circuit device 100 may include a peripheral circuit structure PCS (refer to FIG. 2) arranged under the cell array structure CAS. The peripheral circuit structure PCS may include the peripheral circuit 30 described with reference to FIG. 1. The cell array structure CAS may overlap the peripheral circuit structure PCS with the conductive plate 110 therebetween in the vertical direction (e.g., the Z direction).

The cell array structure CAS may include a plurality of gate lines 130 sequentially stacked on the conductive plate 110 in the vertical direction (e.g., the Z direction). An area associated with the plurality of gate lines 130 on an X-Y plane may be gradually reduced as a distance from the conductive plate 110 increases.

The plurality of gate lines 130 may be divided into the plurality of memory cell blocks BLK by a plurality of word line cut regions WLC that longitudinally extend in a first horizontal direction (e.g., an X direction). The plurality of gate lines 130 included in each of the plurality of memory cell blocks BLK may form a gate stack GS. Each of the plurality of memory cell blocks BLK may include a memory stack MST including one gate stack GS. In each of a plurality of memory stacks MST, the plurality of gate lines 130 may constitute the ground select line GSL, the plurality of word lines WL, and the string select line SSL illustrated in FIG. 3.

Figure 5A:
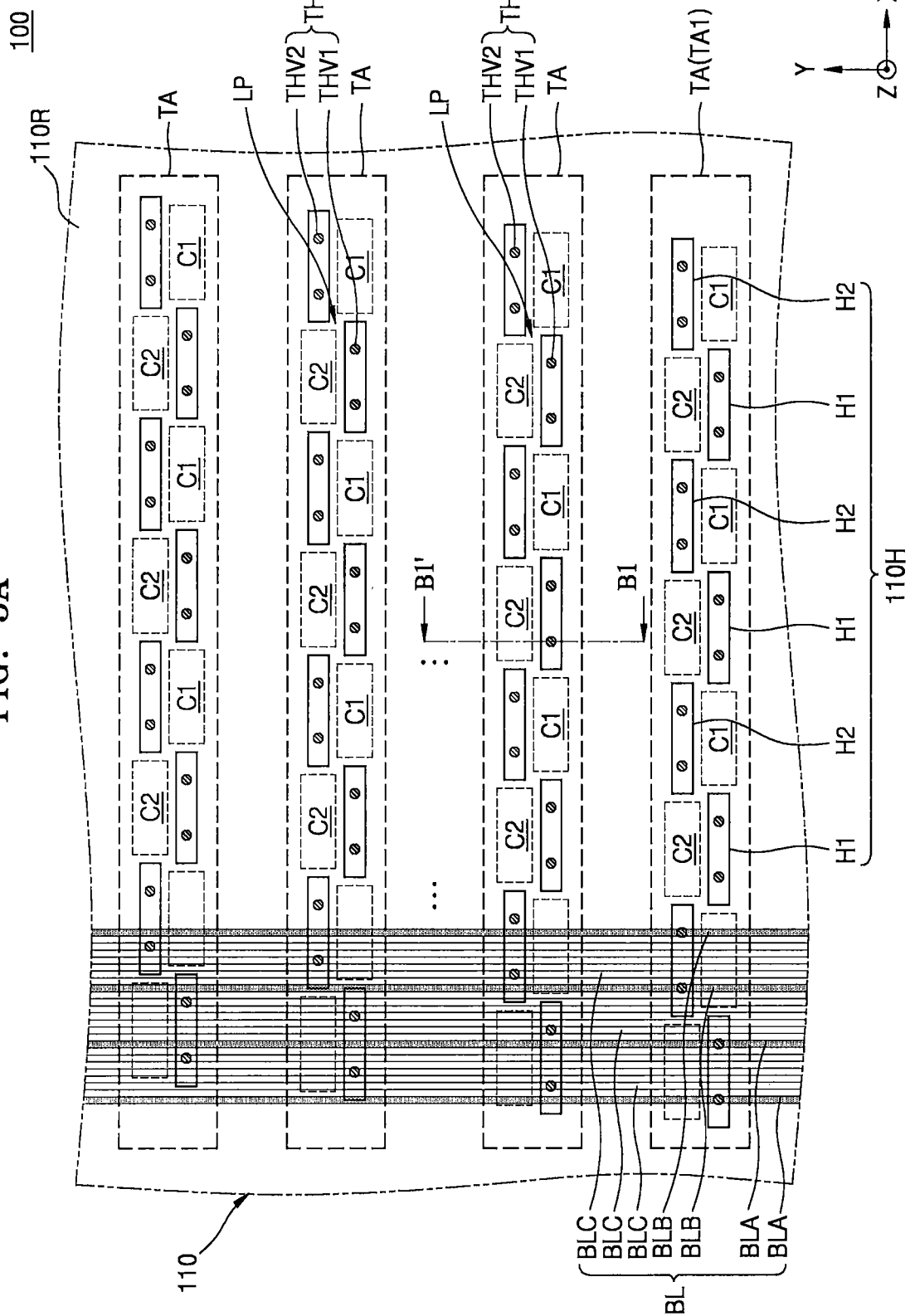
FIG. 5A is an enlarged plan view of a partial region in a conductive plate of the integrated circuit device illustrated in FIG. 4.
Figure 5B:
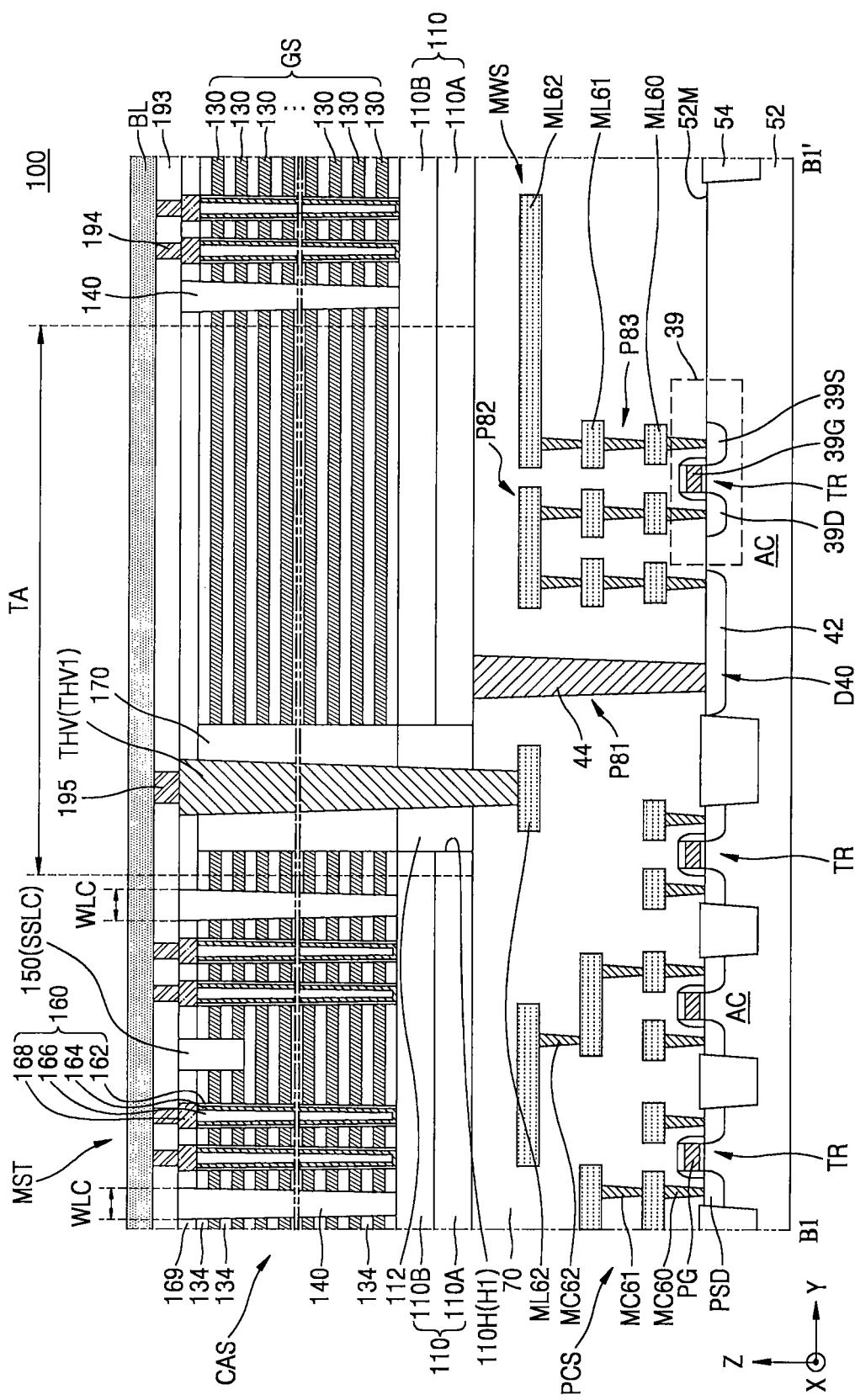
FIG. 5B is an enlarged cross-sectional view showing a part of components taken along the line B1-B1' of FIG. 5A.

FIG. 5A is an enlarged plan view of a partial region in the conductive plate 110 of the integrated circuit device 100 illustrated in FIG. 4, and FIG. 5B is an enlarged cross-sectional view showing a part of components taken along the line B1-B1' of FIG. 5A.

Referring to FIGS. 5A and 5B, the conductive plate 110 may include a plurality of through electrode regions TA. The plurality of through electrode regions TA may longitudinally extend in the first horizontal direction (e.g., the X direction) to run parallel with the plurality of word line cut regions WLC (refer to FIG. 4). In example embodiments, at least one word line cut region WLC and at least one memory stack MST may be included within each of the plurality of through electrode regions TA or between each two of the plurality of through electrode regions TA.

In each of the plurality of through electrode regions TA, a plurality of through holes 110H may be formed. In one through electrode region TA, the plurality of through holes 110H may include a plurality of first through holes H1 that are arranged spaced apart from one another along a first straight line extending in the first horizontal direction (e.g., the X direction). The plurality of through holes 110H may also include a plurality of second through holes H2 that are arranged spaced apart from one another along a second straight line extending in the first horizontal direction (e.g., the X direction) that is apart from the first straight line in a second horizontal direction (e.g., a Y direction). In the one through electrode region TA, the plurality of first through holes H1 and the plurality of second through holes H2 may be offset from each other. The plurality of second through holes H2 may be offset from the plurality of first through holes H1 in the second horizontal direction (e.g., the Y direction). For example, in one through electrode region TA, one first through hole H1 and one second through hole H2 closest to each other in the first horizontal direction (e.g., the X direction) may be offset from each other without being aligned in a straight line along the second horizontal direction (e.g., the Y direction).

The conductive plate 110 may include a plurality of first conductive regions C1 that are arranged one by one between two adjacent first through holes H1 of the plurality of first through holes H1. In addition the conductive plate 110 may include a plurality of second conductive regions C2 that are arranged one by one between two adjacent second through holes H2 of the plurality of second through holes H2.

The plurality of first conductive regions C1 and the plurality of second conductive regions C2 may be connected to each other through a plurality of local conductive regions LP between the first through hole H1 and the second through hole H2. In the conductive plate 110, a zigzag type conductive path may be formed around a certain point of the conductive plate 110 in a radial direction, through the plurality of first conductive regions C1, the plurality of second conductive regions C2, and the plurality of local conductive regions LP.

The plurality of through electrode regions TA may be arranged in various positions in a tile region 110R of the conductive plate 110. For example, the plurality of through electrode regions TA may be arranged approximately in a center of the tile region 110R in the second horizontal direction (e.g., the Y direction), but the inventive concepts are not limited thereto.

As illustrated in FIG. 5B, the integrated circuit device 100 may include the peripheral circuit structure PCS and the cell array structure CAS arranged on the peripheral circuit structure PCS and overlapping the peripheral circuit structure PCS in the vertical direction (e.g., the Z direction).

The conductive plate 110 may be between the peripheral circuit structure PCS and the cell array structure CAS, and thus may perform the function of the common source line CSL illustrated in FIG. 3. In example embodiments, the conductive plate 110 may function as a source region supplying a current to vertical memory cells included in the cell array structure CAS.

In example embodiments, the conductive plate 110 may include a stack structure of a metal plate 110A and a semiconductor plate 110B. The metal plate 110A may include, for example, tungsten (W), and the semiconductor plate 110B may include, for example, doped polysilicon, but the inventive concepts are not limited thereto. The plurality of through holes 110H may penetrate the stack structure of the metal plate 110A and the semiconductor plate 110B, respectively.

The cell array structure CAS may include the memory stack MST arranged on the conductive plate 110. In an upper portion of each of the plurality of through electrode regions TA and/or in an upper portion of a region between each two of the plurality of through electrode regions TA, the memory stack MST with the cross-sectional structure illustrated in FIG. 5B may be arranged.

The memory stack MST may include the gate stack GS. The gate stack GS may include the plurality of gate lines 130 extending parallel to each other in the horizontal direction and overlapping each other in the vertical direction (e.g., the Z direction). Each of the plurality of gate lines 130 may include metal, metal silicide, a semiconductor doped with impurities, or combinations thereof. For example, each of the plurality of gate lines 130 may include metal such as W, nickel (Ni), cobalt (Co), or tantalum (Ta), metal silicide such as W silicide, Ni silicide, Co silicide, or Ta silicide, doped polysilicon, or combinations thereof.

An insulating layer 134 may be between the conductive plate 110 and the plurality of gate lines 130 and between each two of the plurality of gate lines 130. An upper surface of the gate line 130 in the uppermost layer of the plurality of gate lines 130 may also be covered with the insulating layer 134. The insulating layer 134 may include, for example, silicon oxide.

On the conductive plate 110, the plurality of word line cut regions WLC may longitudinally extend across the memory stack MST in the first horizontal direction (e.g., the X direction). A width of each of the plurality of gate lines 130 in the second horizontal direction (e.g., the Y direction) may be limited and/or defined by the plurality of word line cut regions WLC. The plurality of gate lines 130 may be apart from each other by the plurality of word line cut regions WLC at regular intervals and may be repeatedly arranged.

Each of the plurality of word line cut regions WLC may be filled with an insulating layer 140. The insulating layer 140 may include, for example, silicon oxide, silicon nitride, silicon oxynitride, and/or a low dielectric material. For example, the insulating layer 140 may include a silicon oxide layer, a silicon nitride layer, SiON, SiOCN, SiCN, or combinations thereof.

On the conductive plate 110, between two adjacent word line cut regions WLC, the plurality of gate lines 130 that constitute one gate stack GS may be stacked to overlap each other in the vertical direction (e.g., the Z direction). The plurality of gate lines 130 that constitute the one gate stack GS may form the ground selection line GSL, the plurality of word lines WL, and the string selection line SSL described with reference to FIG. 3. In the plurality of gate lines 130, the upper two gate lines 130 may be separated with a string selection line cut region SSLC therebetween in the second horizontal direction (e.g., the Y direction). The upper two gate lines 130 separated from each other with the string selection line cut regions SSLC therebetween may constitute the string selection lines SSL described with reference to FIG. 3. In FIG. 5B, it is illustrated that one string selection line cut region SSLC is formed in one gate stack GS, but the inventive concepts are not limited thereto. For example, at least two string selection line cut regions SSLC may be formed in one gate stack GS. The string selection line cut regions SSLC may be filled with an insulating layer 150. The insulating layer 150 may include, for example, an oxide layer, a nitride layer, or combinations thereof. In example embodiments, at least a portion of the string selection line cut regions SSLC may be filled with an air gap.

On the conductive plate 110, a plurality of channel structures 160 may extend through the plurality of gate lines 130 in the vertical direction (e.g., the Z direction). The plurality of channel structures 160 may be apart from each other at predetermined intervals in the first horizontal direction (e.g., the X direction) and the second horizontal direction (e.g., the Y direction). Each of the plurality of channel structures 160 may include a gate dielectric layer 162, a channel region 164, a buried insulating layer 166, and a drain region 168. The gate dielectric layer 162 may have a structure including a tunneling dielectric layer, a charge storage layer, and a blocking dielectric layer sequentially formed on the channel region 164. The channel region 164 may include, for example, doped polysilicon or undoped polysilicon. The channel region 164 may be cylindrical. An internal space of the channel region 164 may be filled with the buried insulating layer 166. The buried insulating layer 166 may include an insulating material. For example, the buried insulating layer 166 may include silicon oxide, silicon nitride, silicon oxynitride, or combinations thereof. In some embodiments, the buried insulating layer 166 may be omitted. In this case, the channel region 164 may be in the form of a pillar without an internal space. The drain region 168 may include a doped polysilicon layer. The plurality of drain regions 168 may be insulated from each other by an upper insulating layer 169. The upper insulating layer 169 may include, for example, an oxide layer, a nitride layer, or a combination thereof.

The cell array structure CAS may include normal cell regions and dummy cell regions. In the cell array structure CAS, the number and arrangement of normal cell regions and dummy cell regions may vary as required. Among the plurality of channel structures 160, channel structures 160 arranged in the normal cell regions may be normal channel structures and channel structures 160 arranged in the dummy cell regions may be dummy channel structures.

A plurality of bit lines BL may be arranged on the plurality of channel structures 160. In FIG. 5B, one bit line BL among the plurality of bit lines BL is illustrated. However, on the cell array structure CAS, as illustrated in FIG. 5A, the plurality of bit lines BL longitudinally extending in the second horizontal direction (e.g., the Y direction) and being parallel to each other may be arranged. The plurality of bit lines BL may be apart from the conductive plate 110 with the cell array structure CAS therebetween. In this specification, the term "bit line" may be referred to as "a conductive line." The plurality of channel structures 160 may be covered with an insulating layer 193. The plurality of channel structures 160 may be respectively connected to one corresponding bit line BL among the plurality of bit lines BL through one contact pad 194 among the plurality of contact pads 194 that penetrate the insulating layer 193.

The plurality of through holes 110H formed in the through electrode region TA of the conductive plate 110 may be respectively filled with a buried insulating layer 112. In FIG. 5B, one first through hole H1 among the plurality of through holes 110H formed in the through electrode region TA is illustrated. An insulating structure 170 may be arranged on the buried insulating layer 112. The insulating structure 170 may extend in the vertical direction (e.g., the Z direction) through the plurality of gate lines 130 and a plurality of insulating layers 134. The buried insulating layer 112 and the insulating structure 170 may respectively include, for example, a silicon oxide layer.

In the plurality of through electrode regions TA, a plurality of through electrodes THV may extend through the gate lines 130 of the cell array structure CAS in the vertical direction (e.g., the Z direction). The plurality of through electrodes THV may be configured to be respectively connected to one bit line BL of the plurality of bit lines BL. Each of the plurality of through electrodes THV may penetrate the conductive plate 110 through one through hole 110H to be selected from among the plurality of through holes 110H and extend in the vertical direction (e.g., the Z direction) into the inside of the peripheral circuit structure PCS. Each of the plurality of through electrodes THV may be surrounded by the upper insulating layer 169 and the insulating structure 170 in the cell array structure CAS and may be surrounded by the buried insulating layer 112 in the through hole 110H of the conductive plate 110. It will be understood that "an element A surrounds an element B" (or similar language) as used herein means that the element A is at least partially around the element B but does not necessarily mean that the element A completely encloses the element B. Each of the plurality of through electrodes THV may include an upper surface connected to one bit line BL selected from among the plurality of bit lines BL through a contact pad 195 and the other end connected to a peripheral circuit included in the peripheral circuit structure PCS. In this specification, the through electrode THV may be referred to as "a bit line through electrode THV."

In FIG. 5A, it is illustrated that two through electrodes THV penetrate one through hole 110H, but the inventive concepts are not limited thereto. The number and size of through electrodes THV penetrating the one through hole 110H may vary according to the inventive concepts. The plurality of through electrodes THV may include a plurality of first through electrodes THV1 penetrating the plurality of first through holes H1 and a plurality of second through electrodes THV2 penetrating the plurality of second through holes 112.

Each of the plurality of bit lines BL may be connected to one through electrode THV selected from among the plurality of through electrodes THV. In addition, each of the plurality of through electrodes THV may be connected to one bit line BL selected from among the plurality of bit lines BL. In more detail, some bit lines BL selected from the plurality of bit lines BL, for example, a plurality of first bit lines BLA illustrated in FIG. 5A, may be connected to the plurality of first through electrodes THV1 passing through the first through hole H1 of a first through electrode region TA1 selected from the plurality of through electrode regions TA. Other bit lines BL selected from the plurality of bit lines BL, for example, a plurality of second bit lines BLB illustrated in FIG. 5A may be connected to the plurality of second through electrodes THV2 passing through the second through hole 112 of the first through electrode region TA1.

The plurality of bit lines BL may further include a plurality of third bit lines BLC arranged between each of the plurality of first bit lines BLA and each of the plurality of second bit lines BLB. The plurality of third bit lines BLC may not be connected to the plurality of first through electrodes THV1 and the plurality of second through electrodes THV2 passing through the plurality of first through holes 111 and the plurality of second through holes 112 formed in the first through electrode region TA1. The plurality of third bit lines BLC may be connected to one selected from the plurality of first through electrodes THV1 and the plurality of second through electrodes THV2 passing through the plurality of first through holes H1 and the plurality of second through holes H2 formed in, the other through electrode regions TA excluding the first through electrode region TA1 among the plurality of through electrode regions TA. However, the inventive concepts are not limited to the illustration in FIG. 5A, and various modifications and changes may be made. Though FIG. 5A illustrates an example subset of the bit lines BL, including first through third bit lines BLA, BLB, BLC (e.g., on the left side of FIG. 5A), it will be understood that additional bit lines BL are formed on other portions of the conductive plate 110 and connected to various ones of the plurality of first through electrodes THV1 and the plurality of second through electrodes THV2 passing through the plurality of first through holes H1 and the plurality of second through holes H2, as further illustrated in FIG. 5B.

The peripheral circuit structure PCS may include a lower substrate 52, a plurality of peripheral circuits formed on a main surface 52M of the lower substrate 52, and a multilayer wiring structure MWS. Each of the plurality of through electrodes THV may be connected to at least one peripheral circuit selected from the plurality of peripheral circuits through the multilayer wiring structure MWS included in the peripheral circuit structure PCS. The plurality of peripheral circuits included in the peripheral circuit structure PCS may include various circuits included in the peripheral circuit 30 described with reference to FIG. 1. In example embodiments, the plurality of peripheral circuits included in the peripheral circuit structure PCS may include the row decoder 32, the page buffer 34, the data input/output circuit 36, the control logic 38, and the common source line driver 39, illustrated in FIG. 1. The plurality of through electrodes THV may be connected to the page buffer 34 (refer to FIG. 1) among the plurality of peripheral circuits included in the peripheral circuit structure PCS.

The lower substrate 52 may include a semiconductor substrate. For example, the lower substrate 52 may include silicon (Si), germanium (Ge), or SiGe. The active region AC may be defined on the lower substrate 52 by a device isolation layer 54. A plurality of transistors TR constituting the plurality of peripheral circuits may be formed on the active area AC. Each of the transistors TR may include a gate PG and a plurality of ion implantation regions PSD formed in the active region AC on both sides of the gate PG. The plurality of ion implantation regions PSD may constitute a source region or a drain region of the transistor TR, respectively.

The common source line driver 39 may include at least one transistor TR among a plurality of transistors TR included in the peripheral circuit structure PCS. The transistor TR constituting the common source line driver 39 may include a gate 39G arranged on the lower substrate 52, a source 39S formed in the lower substrate 52 at a position adjacent to one side of the gate 39G, and a drain 39D formed in the lower substrate 52 at a position adjacent to the other side of the gate 39G.

The common source line driver 39 may be arranged in a plurality of positions that vertically overlap the plurality of first conductive regions C1 and the plurality of second conductive regions C2 included in the conductive plate 110 in regions adjacent to the plurality of through electrodes THV.

The multilayer wiring structure MWS may include a plurality of peripheral circuit wiring layers ML60, ML61, and ML62 and a plurality of peripheral circuit contacts MC60, MC61, and MC62, connected to the plurality of peripheral circuits included in the peripheral circuit structure PCS. At least some of the plurality of peripheral circuit wiring layers ML60, ML61, and ML62 may be configured to be electrically connectable to the transistor TR. The plurality of peripheral circuit contacts MC60, MC61, and MC62 may be configured so that the plurality of transistors TR are connected to some peripheral circuit wiring layers selected from among the plurality of peripheral circuit wiring layers ML60, ML61, and ML62. A bottom surface of each of the plurality of through electrodes THV may be connected to one of the plurality of peripheral circuit wiring layers ML60, ML61, and ML62. For example, the bottom surface of each of the plurality of through electrodes THV may be connected to the uppermost peripheral circuit wiring layer ML62 closest to the cell array structure CAS among the plurality of peripheral circuit wiring layers ML60, ML61, and ML62. In FIG. 5B, it is illustrated that the multilayer wiring structure MWS has three wiring layers in the vertical direction (e.g., the Z direction), but the inventive concepts are not limited thereto. For example, the multilayer wiring structure MWS may have two or more wiring layers.

In example embodiments, thicknesses of the plurality of peripheral circuit wiring layers ML60, ML61, and ML62 in the vertical direction (e.g., the Z direction) may be different from each other. For example, the plurality of peripheral circuit wiring layers ML60, ML61, and ML62 may have different thicknesses according to a distance from the lower substrate 52 in the vertical direction (e.g., the Z direction). In example embodiments, widths of the plurality of peripheral circuit contacts MC60, MC61, and MC62 in the horizontal direction (for example, the X direction or the Y direction) may be different from each other according to the distance from the lower substrate 52 in the vertical direction (e.g., the Z direction). For example, the width of the plurality of peripheral circuit contacts MC60, MC61, and MC62 in the horizontal direction may decrease as the distance in the vertical direction (e.g., the Z direction) from the lower substrate 52 decreases.

The peripheral circuit structure PCS may further include an arc protection diode D40 formed on the lower substrate 52. The arc protection diode D40 and the conductive plate 110 may be interconnected by the first wiring structure P81.

The arc protection diode D40 may include an arc protection ion implantation region 42. In example embodiments, the active region AC of the lower substrate 52 may include an ion implantation region of a first conductivity type, and the arc protection ion implantation region 42 may include an ion implantation region of a second conductivity type. When the first conductivity type is N type, the second conductivity type may be P type, and when the first conductivity type is P type, the second conductivity type may be N type. The ion implantation region of the first conductivity type and the ion implantation region of the second conductivity type may form a PN junction diode. The arc protection ion implantation region 42 may be of the same conductivity type as the source 39S and the drain 39D of the common source line driver 39.

The first wiring structure P81 may include a bypass via contact 44 including a top surface that contacts a bottom surface of the conductive plate 110 and a bottom surface that contacts the arc protection ion implantation region 42 constituting the arc protection diode D40.

The drain 39D of the common source line driver 39 may be horizontally spaced apart from the arc protection diode D40, and may be connected to the arc protection ion implantation region 42 of the arc protection diode D40 through a second wiring structure P82. The source 39S of the common source line driver 39 may be connected to a ground power supply (not shown) through a third wiring structure P83.

The second wiring structure P82 and the third wiring structure P83 may be parts of the multilayer wiring structure MWS. The second wiring structure P82 and the third wiring structure P83 may include a multilayer wiring structure. In FIG. 5B, it is illustrated that the second wiring structure P82 and the third wiring structure P83 include the peripheral circuit wiring layers ML60, ML61, and ML62 that are formed at different vertical levels and the plurality of peripheral circuit contacts MC60, MC61, and MC62 for interconnecting some of the peripheral circuit wiring layers ML60, ML61, and ML62, and an uppermost wiring layer of the second wiring structure P82 and the third wiring structure P83 is the peripheral circuit wiring layer ML62, but the inventive concepts are not limited thereto. For example, the uppermost wiring layer of at least one of the second wiring structure P82 and the third wiring structure P83 may be the peripheral circuit wiring layer ML60 or the peripheral circuit wiring layer ML61.

In example embodiments, when unwanted charges accumulate in the conductive plate 110, a high current due to arcing that may occur due to the accumulated charges may be bypassed to the lower substrate 52 through the first wiring structure P81 and the arc protection diode D40. Therefore, the common source line driver 39 may be protected from being deteriorated due to arcing caused by the accumulation of unwanted charges in the conductive plate 110.

The bypass via contact 44, the plurality of peripheral circuit wiring layers ML60, ML61, and ML62, and the plurality of peripheral circuit contacts MC60, MC61, and MC62 may each include metal, conductive metal nitride, metal silicide, or combinations thereof. For example, the bypass via contact 44, the plurality of peripheral circuit wiring layers ML60, ML61, and ML62, and the plurality of peripheral circuit contacts MC60, MC61, and MC62 may each include, for example, a conductive material such as tungsten, molybdenum, titanium, cobalt, tantalum, nickel, tungsten silicide, titanium silicide, cobalt silicide, tantalum silicide, and/or nickel silicide.

The plurality of transistors TR, the bypass via contact 44, and the multilayer wiring structure MWS included in the peripheral circuit structure PCS may be covered with an interlayer insulating layer 70. The plurality of through electrodes THV may contact an upper surface of the peripheral circuit wiring layer ML62 through a part of the interlayer insulating layer 70. The interlayer insulating layer 70 may include, for example, silicon oxide, SiON, and SiOCN, and the like.

Figure 6:
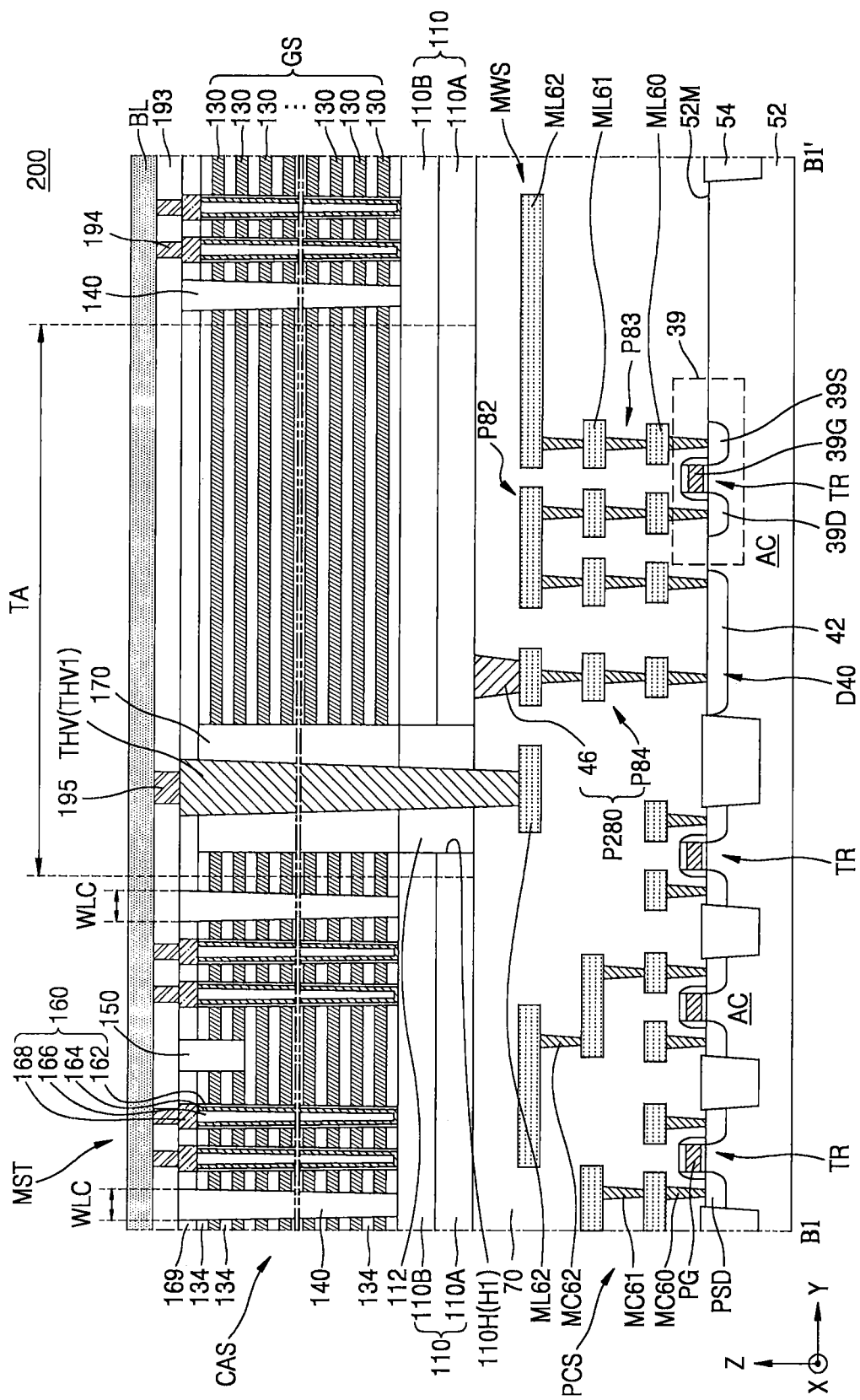
FIG. 6 is a cross-sectional view of an integrated circuit device according to another embodiment of the inventive concepts.

FIG. 6 is a cross-sectional view of an integrated circuit device 200 according to another embodiment of the inventive concepts. FIG. 6 shows an enlarged view of some of the components corresponding to a cross-section taken the line B1-B1' of FIG. 5A.

Referring to FIG. 6, the integrated circuit device 200 may include substantially the same configuration as the integrated circuit device 100 described with reference to FIGS. 5A and 5B. However, the integrated circuit device 200 may include a first wiring structure P280 instead of the first wiring structure P81. The first wiring structure P280 may include a bypass via contact 46 having an upper surface that contacts the bottom surface of the conductive plate 110 and an intermediate wiring structure P84 connected between the bypass via contact 46 and the arc protection ion implantation region 42. The intermediate wiring structure P84 may be part of the multilayer wiring structure MWS. The intermediate wiring structure P84 may include a multilayer wiring structure. In FIG. 6, it is illustrated that the intermediate Wiring structures P84 include the peripheral circuit wiring layers ML60, ML61, and ML62 that are formed at different vertical levels and the plurality of peripheral circuit contacts MC60, MC61, and MC62 for interconnecting some of the peripheral circuit wiring layers ML60, ML61, and ML62, and an uppermost wiring layer of the intermediate wiring structures P84 is the peripheral circuit wiring layer ML62, but the inventive concepts are not limited thereto. For example, the uppermost wiring layer of the intermediate wiring structure P84 may be the peripheral circuit wiring layer ML60 or the peripheral circuit wiring layer ML61. An upper surface of the uppermost wiring layer of the intermediate wiring structure P84 may contact the bottom surface of the bypass via contact 46. The peripheral circuit contact MC60 at the lowest portion of the intermediate wiring structure P84 may contact the arc protection ion implantation region 42.

In example embodiments, when unwanted charges accumulate in the conductive plate 110, high currents due to arcing that may be caused by the accumulated charges may be bypassed to the lower substrate 52, through the first wiring structure P280 including the bypass via contact 46 and the intermediate wiring structure P84 and the arc protection diode D40. Therefore, the common source line driver 39 may be protected from being deteriorated due to arcing caused by the accumulation of unwanted charges in the conductive plate 110.

Figure 7:
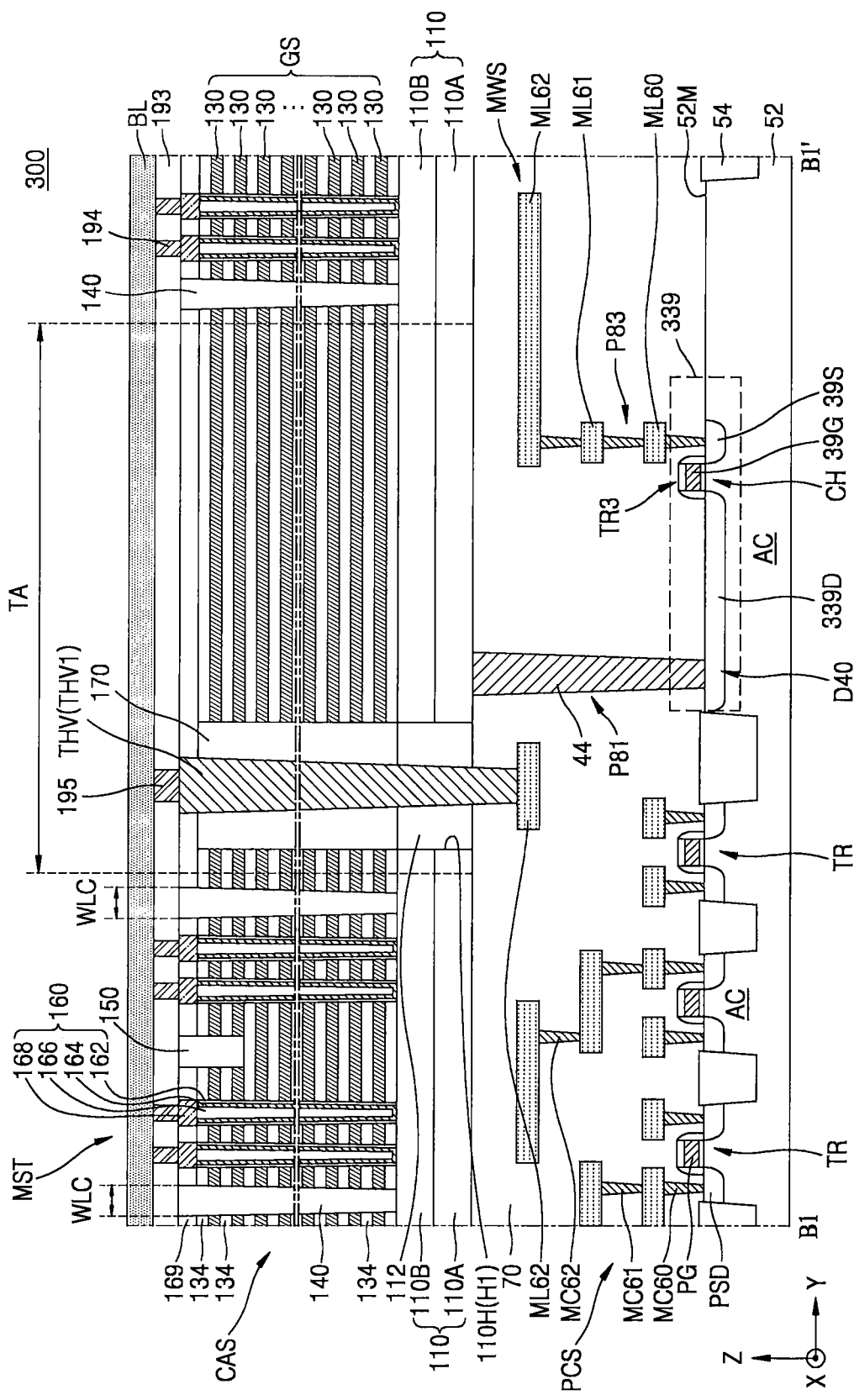
FIG. 7 is a cross-sectional view of an integrated circuit device according to another embodiment of the inventive concepts.

FIG. 7 is a cross-sectional view illustrating an integrated circuit device 300 according to another embodiment of the inventive concepts. FIG. 7 shows an enlarged view of some of the components corresponding to a cross-section taken the line B1-B1' of FIG. 5A.

Referring to FIG. 7, the integrated circuit device 300 may include substantially the same configuration as the integrated circuit device 100 described with reference to FIGS. 5A and 5B. However, in the integrated circuit device 300, the peripheral circuit structure PCS may include a common source line driver 339.

The common source line driver 339 may include a transistor TR3. The transistor TR3 constituting the common source line driver 339 may include a gate 39G, a source 39S formed in the lower substrate 52 at a position adjacent to one side of the gate 39G, and a drain 339D formed in the lower substrate 52 at a position adjacent to the other side of the gate 39G. The drain 339D may be formed integrally and/or integrated with the arc protection diode D40. The detailed configuration of the arc protection diode D40 is the same as that described with reference to FIG. 5B. In the integrated circuit device 300, the drain 339D of the transistor TR3 may perform the function of the arc protection diode D40. The bypass via contact 44 may have a bottom surface contacting the arc protection diode D40 and the drain 339D. In the integrated circuit device 300 illustrated in FIG. 7, the second wiring structure P82 illustrated in FIG. 5B may be omitted.

Figure 8:
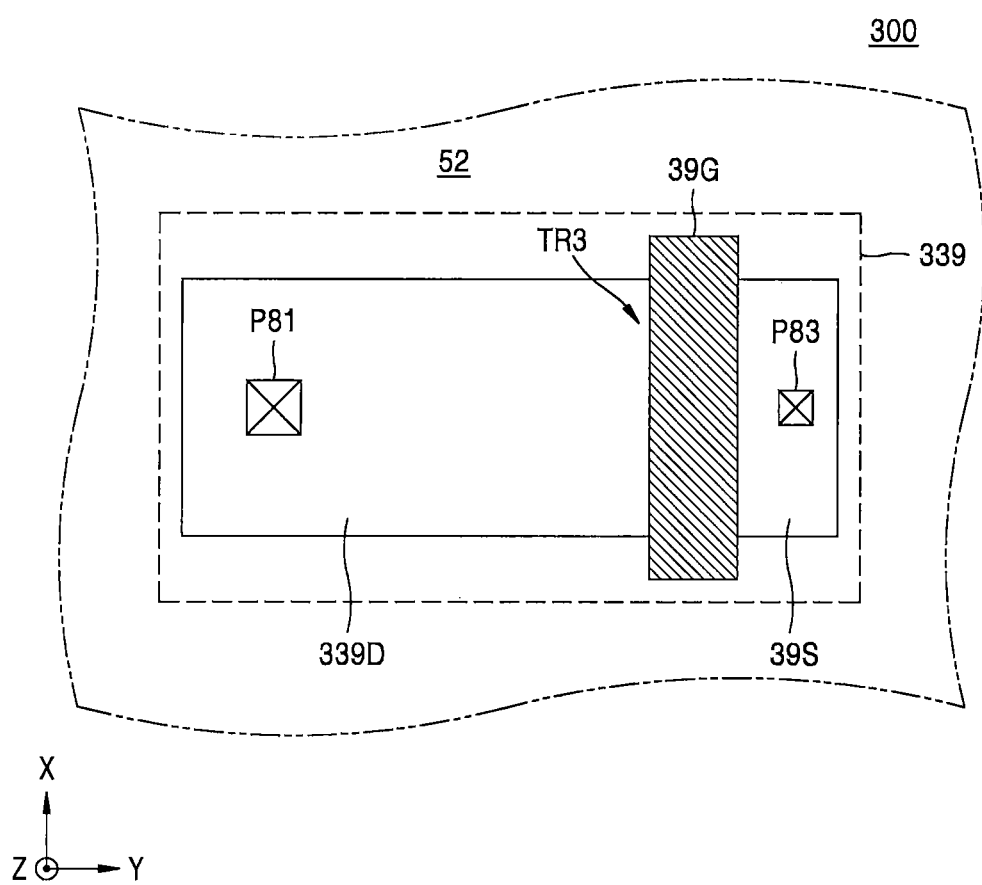
FIG. 8 is a schematic planar layout of a transistor constituting a common source line driver illustrated in FIG. 7.

FIG. 8 is a schematic planar layout of the transistor TR3 constituting the common source line driver 339 illustrated in FIG. 7.

Referring to FIGS. 7 and 8, the transistor TR3 constituting the common source line driver 339 may have an asymmetric structure in which the source 39S and the drain 339D have different planar areas. In the lower substrate 52, a first planar area occupied by the drain 339D may be greater than a second planar area occupied by the source 39S.

A length of the drain 339D in a channel length direction (e.g., the Y direction in FIGS. 7 and 8) which are formed in the channel region CH of the transistor TR3 constituting the common source line driver 339 may be greater than a length of the source 39S. As used herein, the term "channel length" refers to a distance between the source 39S and the drain 339D in the channel region CH. In the transistor TR3 constituting the common source line driver 339, the shortest distance from the gate 39G to the first wiring structure P81 in the channel length direction may be greater than the shortest distance from the gate 39G to the third wiring structure P83.

In example embodiments, when unwanted charges accumulate in the conductive plate 110, high currents due to arcing that may be generated due to the accumulated charges may be bypassed to the lower substrate 52 through the first wiring structure P81 and the arc protection diode D40. Therefore, the common source line driver 339 may be protected from being deteriorated due to arcing caused by the accumulation of unwanted charges in the conductive plate 110.

Figure 9:
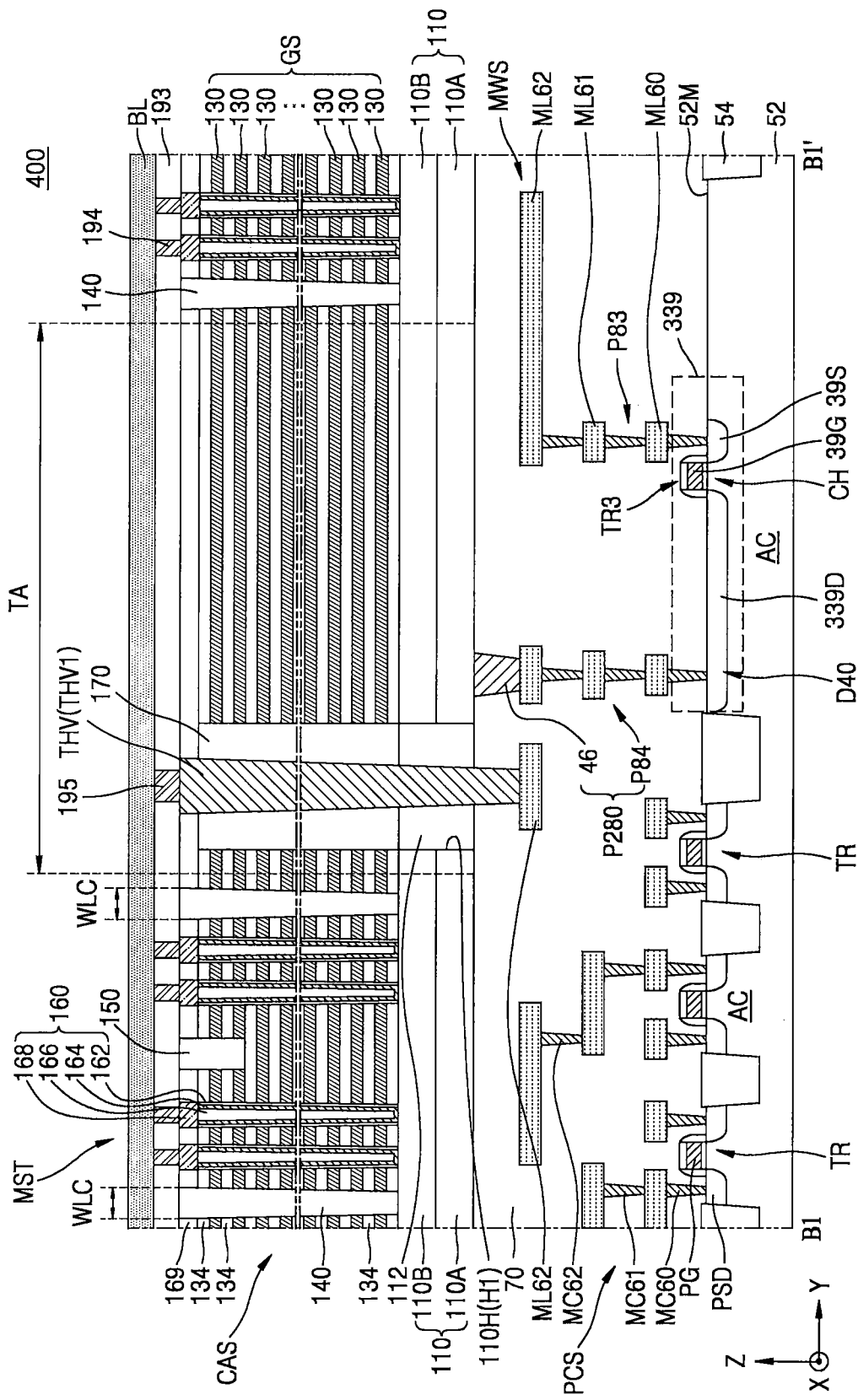
FIG. 9 is a cross-sectional view of an integrated circuit device according to another embodiment of the inventive concepts.

FIG. 9 is a cross-sectional view illustrating an integrated circuit device 400 according to another embodiment of the inventive concepts. FIG. 9 shows an enlarged view of some of the components corresponding to a cross-section taken the line B1-B1' of FIG. 5A.

Referring to FIG. 9, the integrated circuit device 400 may include substantially the same configuration as the integrated circuit device 300 described with reference to FIG. 7. However, the integrated circuit device 400 may include a first wiring structure P280 instead of the first wiring structure P81. The first wiring structure P280 may include the bypass via contact 46 and the intermediate wiring structure P84. In the integrated circuit device 400, the drain 339D integrally connected to and/or integrated with the arc protection diode D40 and the bypass via contact 46 may be interconnected through the intermediate wiring structure P84. The more detailed configuration of the first wiring structure P280 including the bypass via contact 46 and the intermediate wiring structure P84 may be the same as that described with reference to FIG. 6.

In example embodiments, when unwanted charges accumulate in the conductive plate 110, high currents due to arcing that may be generated due to the accumulated charges may be bypassed to the lower substrate 52 through the first wiring structure P280 and the arc protection diode D40. Therefore, the common source line driver 339 may be protected from being deteriorated due to arcing caused by the accumulation of unwanted charges in the conductive plate 110.

Figure 10A:
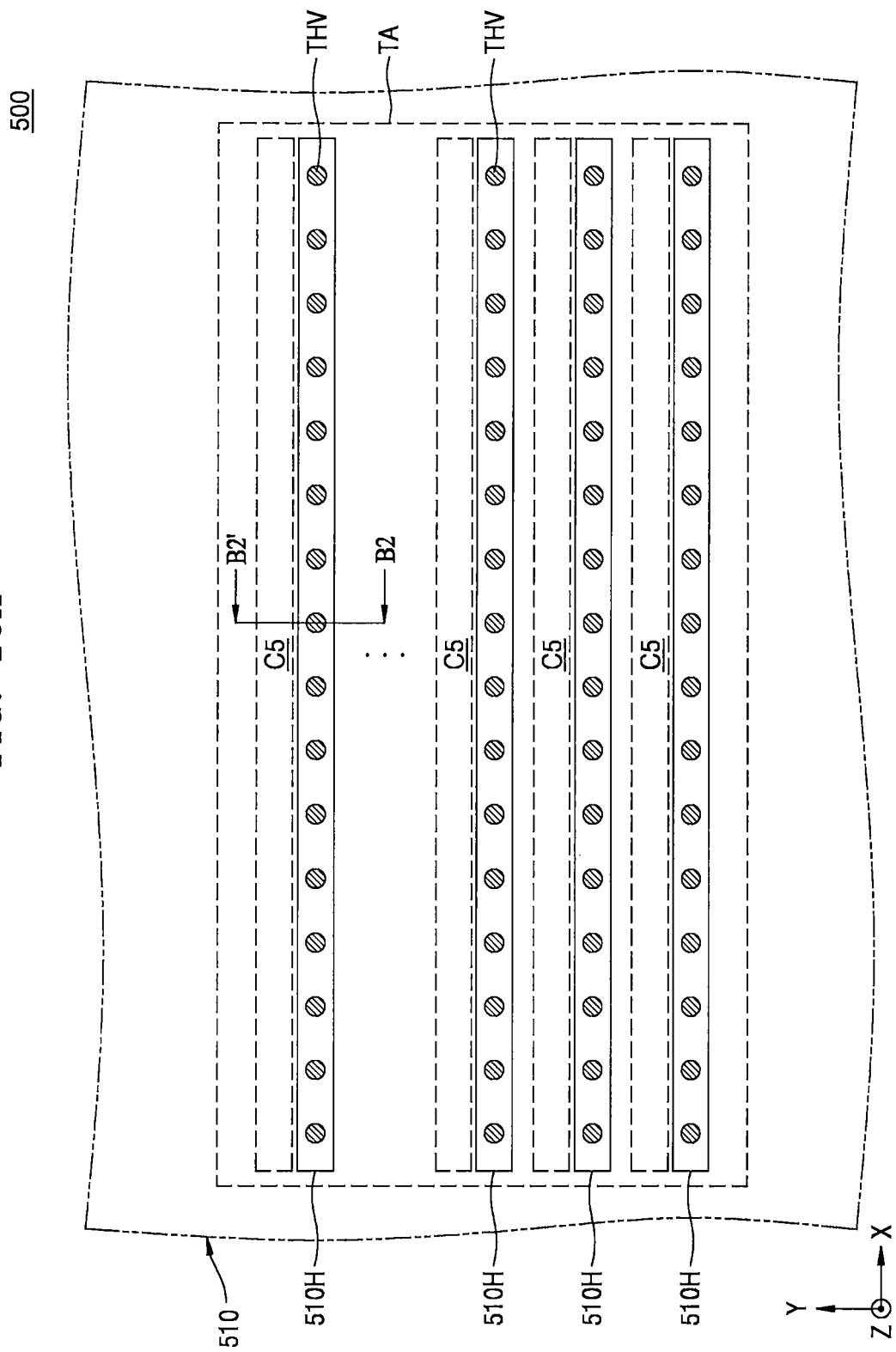
FIG. 10A is an enlarged plan view of a partial region in a conductive plate of an integrated circuit device according to another embodiment of the inventive concepts.
Figure 10B:
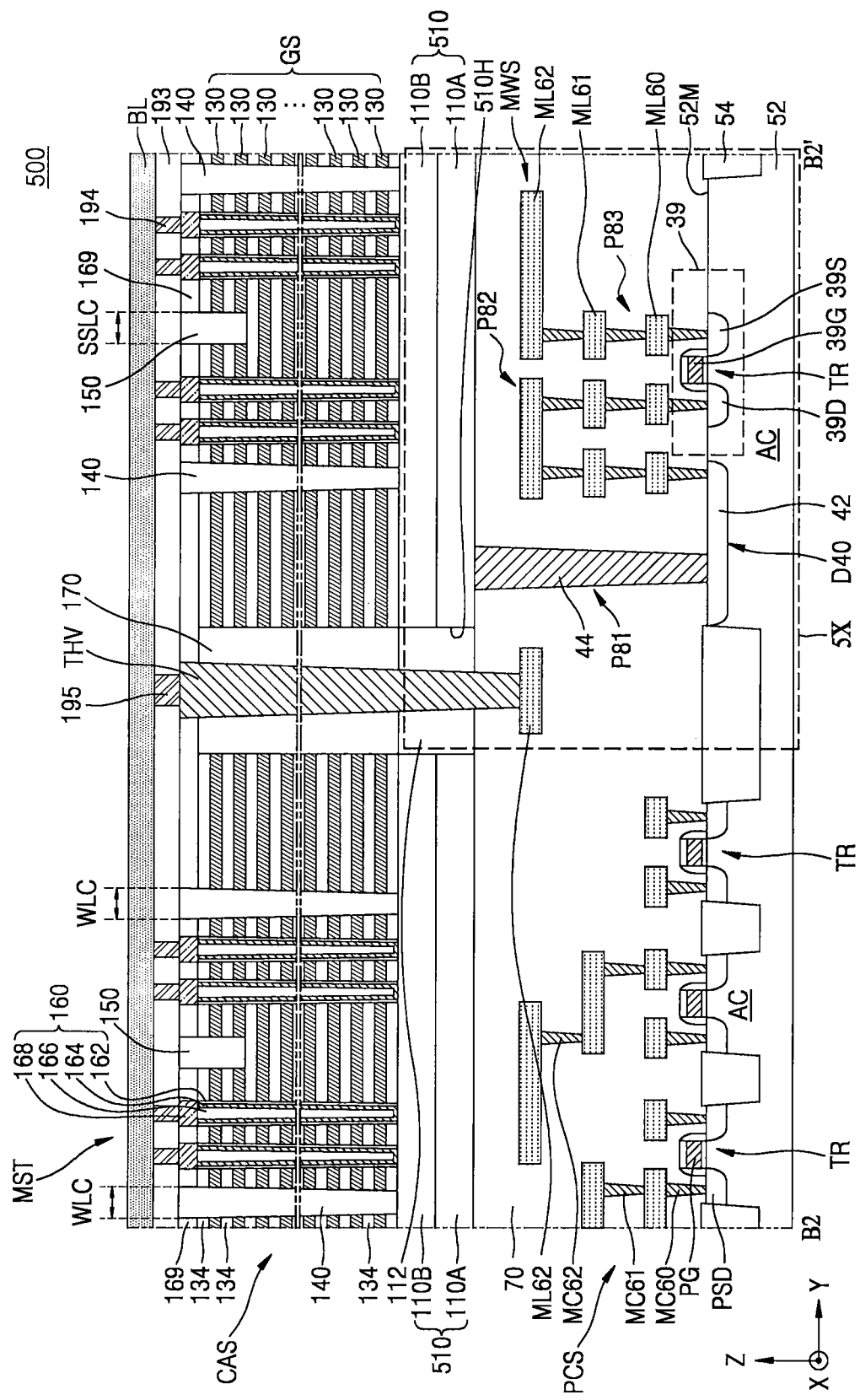
FIG. 10B is an enlarged cross-sectional view showing a part of components taken along the line B2-B2' of FIG. 10A.

FIGS. 10A and 10B are diagrams for describing an integrated circuit device 500 according to another embodiment of the inventive concepts, and FIG. 10A is an enlarged plan view of a partial region of a conductive plate 510 of the integrated circuit device 500 and FIG. 10B is an enlarged cross-sectional view showing a part of components taken along the line B2-B2' of FIG. 10A.

The integrated circuit device 500 may include substantially the same configuration as the integrated circuit device 100 described with reference to FIGS. 4, 5A, and 5B. However, the integrated circuit device 500 may include the conductive plate 510 instead of the conductive plate 110.

The conductive plate 510 may include substantially the same configuration as the conductive plate 110 described with reference to FIGS. 4, 5A, and 5B. However, the conductive plate 510 may include a plurality of through holes 510H extending in the first horizontal direction (e.g., the X direction) parallel to the plurality of word line cut regions WLC (see FIG. 4). The plurality of through holes 510H may extend parallel to each other.

The conductive plate 510 may include a plurality of conductive regions C5 adjacent to each of the plurality of through holes 510H in the second horizontal direction (e.g., the Y direction) and extending longitudinally in the first horizontal direction (e.g., the X direction).

As illustrated in FIG. 10B, the conductive plate 510 may be between the peripheral circuit structure PCS and the cell array structure CAS to perform the function of the common source line CSL illustrated in FIG. 3. The conductive plate 510 may function as a source region supplying current to vertical memory cells included in the cell array structure CAS. The conductive plate 510 may include a stack structure of a metal plate 110A and a semiconductor plate 110B similarly as described with reference to FIG. 5B. The plurality of through holes 510H may penetrate the stack structure of the metal plate 110A and the semiconductor plate 110B. The plurality of through holes 510H may be filled with the buried insulating layer 112.

The plurality of through electrodes THV may longitudinally extend in the vertical direction (e.g., the Z direction) to the inside of the peripheral circuit structures PCS while penetrating the gate line 130 of the cell array structure CAS and also penetrating the conductive plate 510 through one through hole 510H selected from among the plurality of through holes 510H. The detailed configuration of the plurality of through electrodes THV is the same as that described with reference to FIGS. 5A and 5B.

The peripheral circuit structure PCS may have substantially the same configuration as that described with reference to FIG. 5B. The common source line driver 39 included in the peripheral circuit structure PCS may be arranged at a plurality of positions that vertically overlap the plurality of conductive regions C5 included in the conductive plate 510, in regions adjacent to the plurality of through electrodes THV.

The peripheral circuit structure PCS may include the arc protection diode D40 formed on the lower substrate 52 and the first wiring structure P81 connected between the arc protection diode D40 and the conductive plate 510. The first wiring structure P81 may include the bypass via contact 44. The arc protection diode D40 may include the arc protection ion implantation region 42. The arc protection ion implantation region 42 may be of the same conductivity type as the source 39S and the drain 39D of the common source line driver 39. The drain 39D of the common source line driver 39 may be horizontally spaced apart from the arc protection diode D40, and may be connected to the arc protection ion implantation region 42 of the arc protection diode D40 through a second wiring structure P82. The source 39S of the common source line driver 39 may be connected to a ground power supply (not shown) through a third wiring structure P83.

In example embodiments, when unwanted charges accumulate in the conductive plate 510, high currents due to arcing that may be caused by the accumulated charges may be bypassed to the lower substrate 52 through the first wiring structure P81 and the arc protection diode D40. Therefore, the common source line driver 39 may be protected from being deteriorated due to arcing caused by the accumulation of unwanted charges in the conductive plate 510.

Figure 11:
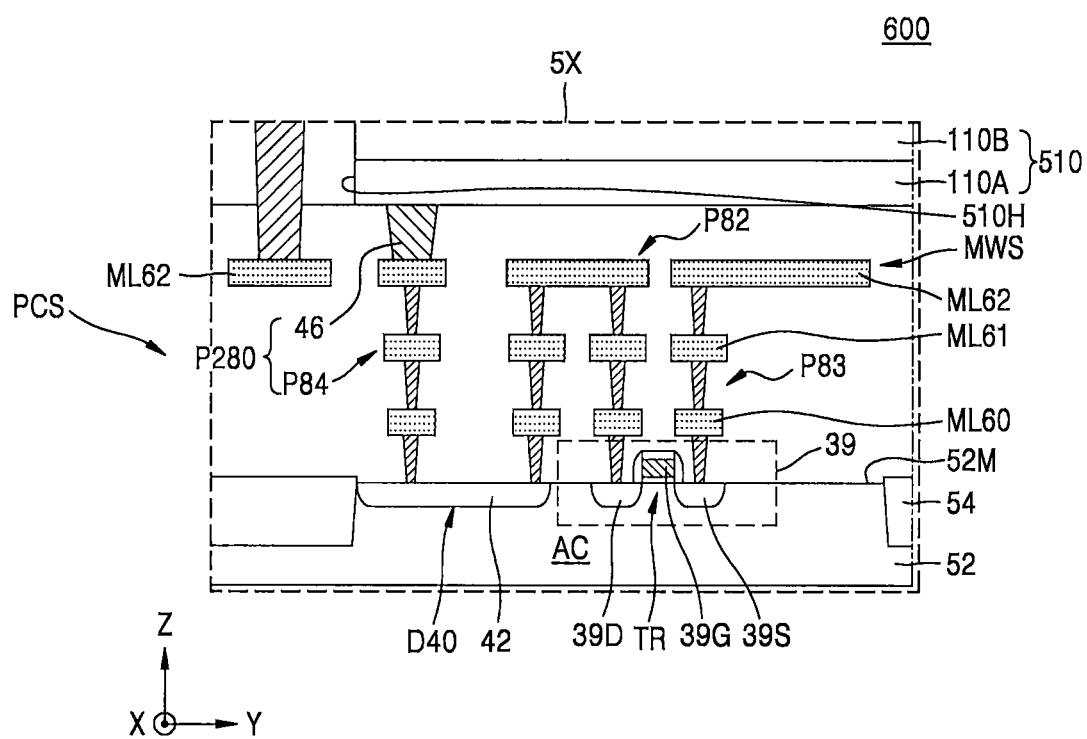
FIG. 11 is a cross-sectional view of an integrated circuit device according to another embodiment of the inventive concepts.

FIG. 11 is a cross-sectional view illustrating an integrated circuit device 600 according to another embodiment of the inventive concepts. FIG. 11 illustrates a cross-sectional configuration of a portion corresponding to a region 5X in FIG. 10B from among some configurations of portions corresponding to the cross-sectional configurations taken along the line B2-B2' of FIG. 10A.

Referring to FIG. 11, the integrated circuit device 600 may include substantially the same configuration as the integrated circuit device 500 described with reference to FIGS. 10A and 10B. However, the integrated circuit device 600 may include the first wiring structure P280 instead of the first wiring structure P81. The detailed configuration of the first wiring structure P280 is the same as that described with reference to FIG. 6.

Figure 12:
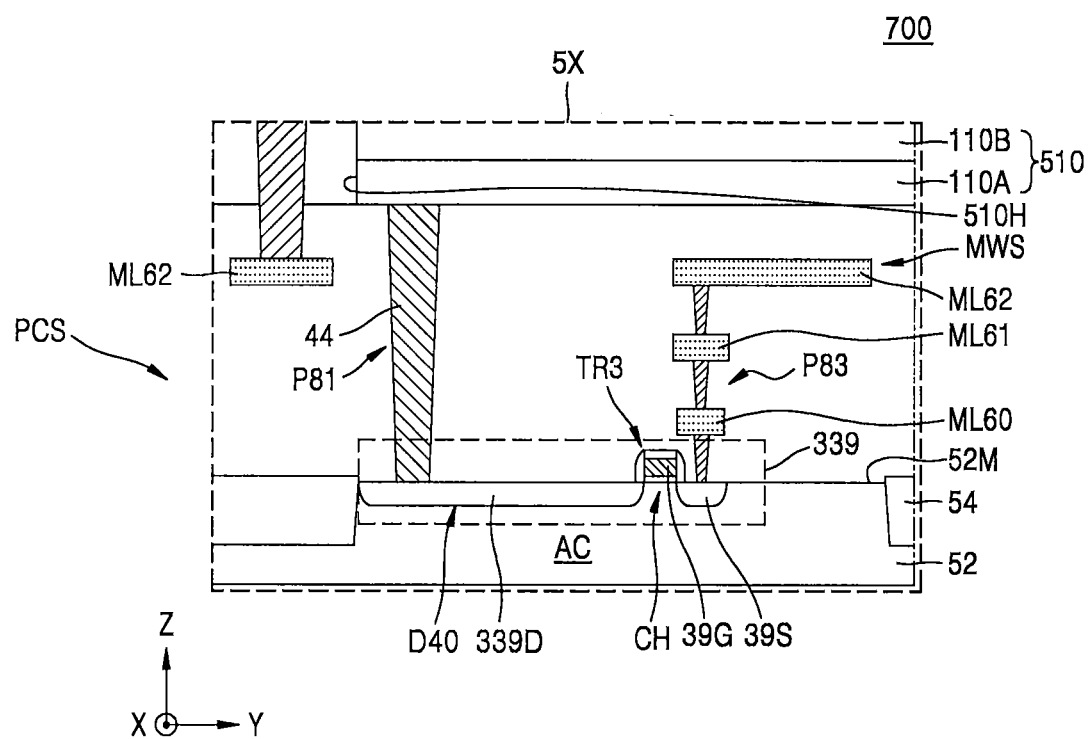
FIG. 12 is a cross-sectional view of an integrated circuit device according to another embodiment of the inventive concepts.

FIG. 12 is a cross-sectional view illustrating an integrated circuit device 700 according to another embodiment of the inventive concepts. FIG. 12 illustrates a cross-sectional configuration of a portion corresponding to a region 5X in FIG. 10B from among some configurations of portions corresponding to the cross-sectional configurations taken along the line B2-B2' of FIG. 10A.

Referring to FIG. 12, the integrated circuit device 700 may include substantially the same configuration as the integrated circuit device 500 described with reference to FIGS. 10A and 10B. However, in the integrated circuit device 700, the peripheral circuit structure PCS may include a common source line driver 339. The detailed configuration of the common source line driver 339 is the same as that described with reference to FIG. 7. The transistor TR3 constituting the common source line driver 339 illustrated in FIG. 12 may have an asymmetric structure in which the source 39S and the drain 339D have different planar areas. In the lower substrate 52, the first planar area occupied by the drain 339D may be greater than the second planar area occupied by the source 39S. The more detailed description of the transistor TR3 constituting the common source line driver 339 is the same as that described with reference to FIGS. 7 and 8.

Figure 13:
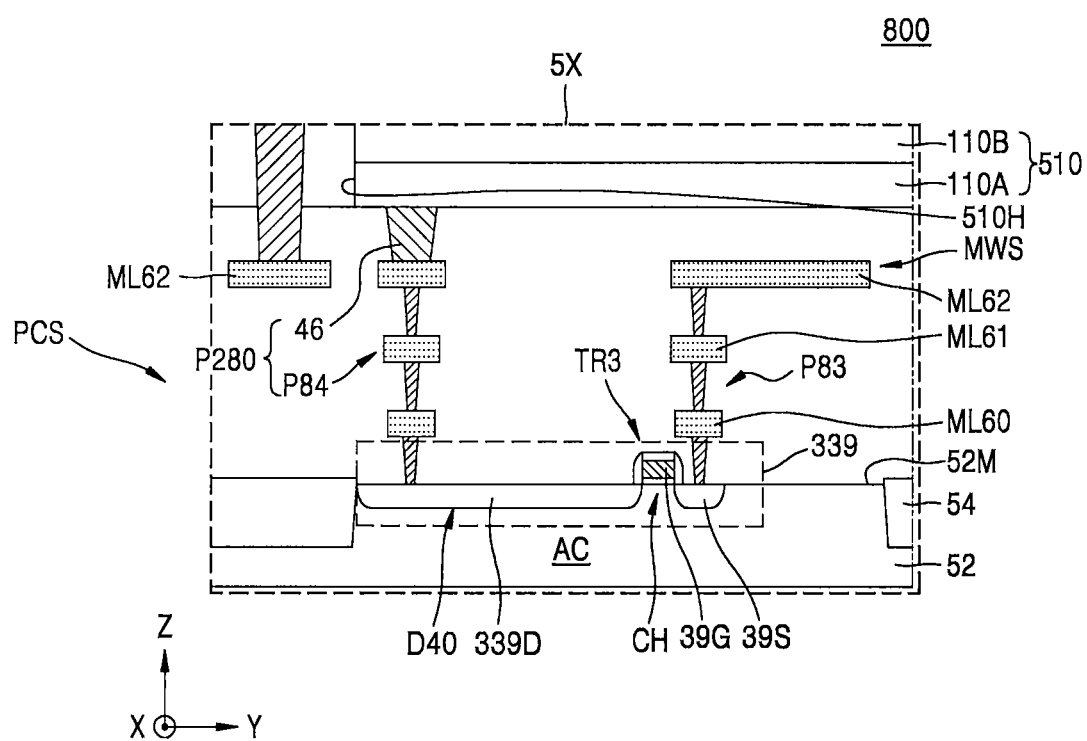
FIG. 13 is a cross-sectional view of an integrated circuit device according to another embodiment of the inventive concepts.

FIG. 13 is a cross-sectional view illustrating an integrated circuit device 800 according to another embodiment of the inventive concepts. FIG. 13 illustrates a cross-sectional configuration of a portion corresponding to a region 5X in FIG. 10B from among some configurations of portions corresponding to the cross-sectional configurations taken along the line B2-B2' of FIG. 10A.

Referring to FIG. 13, the integrated circuit device 800 may include substantially the same configuration as the integrated circuit device 700 described with reference to FIG. 12. However, the integrated circuit device 800 may include the first wiring structure P280 instead of the first wiring structure P81. The more detailed configuration of the first wiring structure P280 is the same as that described with reference to FIG. 6.

Figure 14:
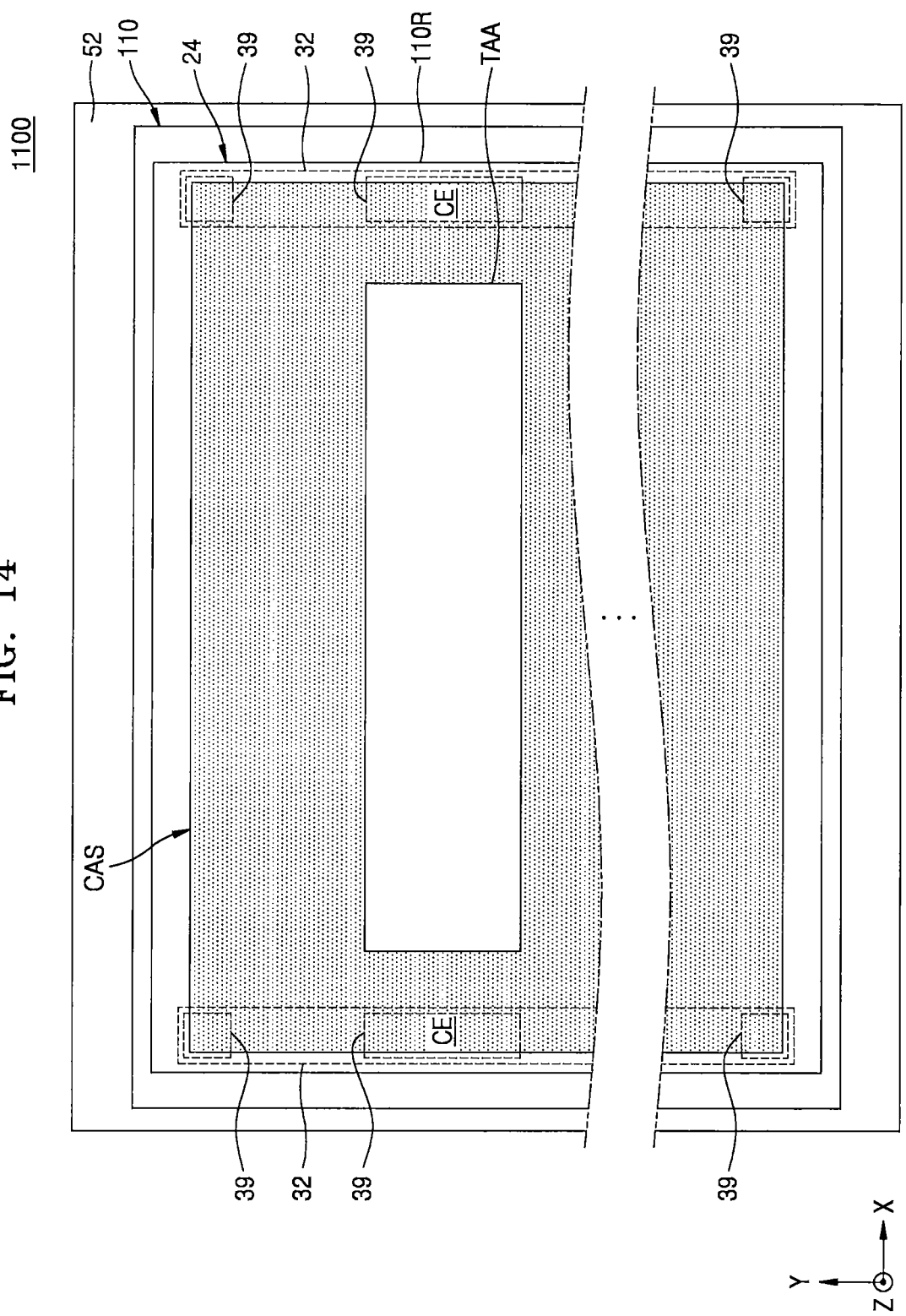
FIG. 14 is a schematic plan view of a planar arrangement of some components of an integrated circuit device according to embodiments of the inventive concepts.

FIG. 14 is a schematic plan view of a planar arrangement of some components of an integrated circuit device 1100 according to embodiments of the inventive concepts.

Referring to FIG. 14, in the integrated circuit device 1100, the lower substrate 52 and the conductive plate 110 may vertically overlap each other, and the conductive plate 110 may include the tile region 110R, which is at a position corresponding to one tile 24.

The cell array structure CAS may be arranged on the tile region 110R of the conductive plate 110, and a through electrode region TAA may be arranged in a portion of the conductive plate 110 under the cell array structure CAS. The detailed configuration of the cell array structure CAS is the same as that described with reference to FIGS. 4 and 5B. The through electrode region TAA may have the same configuration as that described for the plurality of through electrode regions TA illustrated in FIG. 5A or the through electrode region TA illustrated in FIG. 10A.

The peripheral circuit structure PCS arranged under the conductive plate 110 may include the row decoder 32 as described with reference to FIG. 1. The row decoder 32 may be arranged in a region longitudinally extending in the second horizontal direction (e.g., the Y direction) along edge portions of both sides of the tile 24 under the conductive plate 110 in the first horizontal direction (e.g., the X direction).

The conductive plate 110 may include a plurality of first edge-side conductive regions CE that are arranged on opposite sides of the tile region 110R in the first horizontal direction (e.g., the X direction) and vertically overlap the row decoder 32.

In the integrated circuit device 1100, the common source line driver 39 may be arranged in at least one position selected from among a plurality of positions that vertically overlap the plurality of first edge-side conductive regions CE included in the conductive plate 110. In example embodiments, the common source line driver 39 may be arranged at a position adjacent to the through electrode region TAA among the plurality of first edge-side conductive regions CE.

Figure 15:
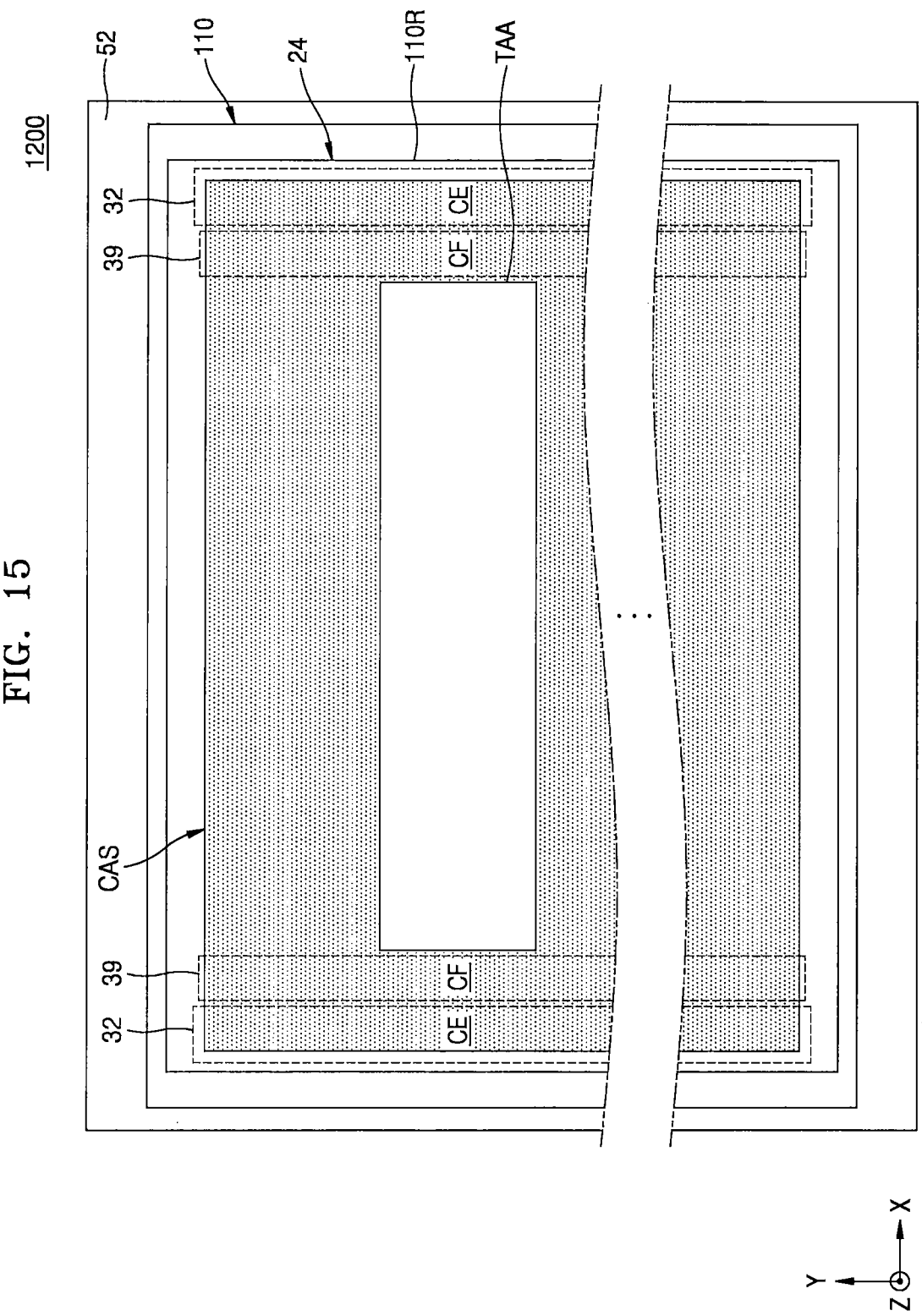
FIG. 15 is a schematic plan view of a planar arrangement of some components of an integrated circuit device according to embodiments of the inventive concepts.

FIG. 15 is a schematic plan view of a planar arrangement of some components of an integrated circuit device 1200 according to embodiments of the inventive concepts.

Referring to FIG. 15, the integrated circuit device 1200 may include substantially the same configuration as the integrated circuit device 1100 described with reference to FIG. 14. However, the conductive plate 110 may include a plurality of interface conductive regions CF arranged on opposite sides of the tile region 110R in the first horizontal direction (e.g., the X direction). Each of the plurality of interface conductive regions CF may be a region that longitudinally extends in the second horizontal direction (e.g., the Y direction) between the first edge-side conductive region CE and the through electrode region TAA.

In the integrated circuit device 1200, the common source line driver 39 may be arranged in at least one position selected from among a plurality of positions that vertically overlap the plurality of interface conductive regions CF included in the conductive plate 110. In example embodiments, the common source line driver 39 may be arranged at a position adjacent to the through electrode region TAA among the plurality of interface conductive regions CF.

Figure 16:
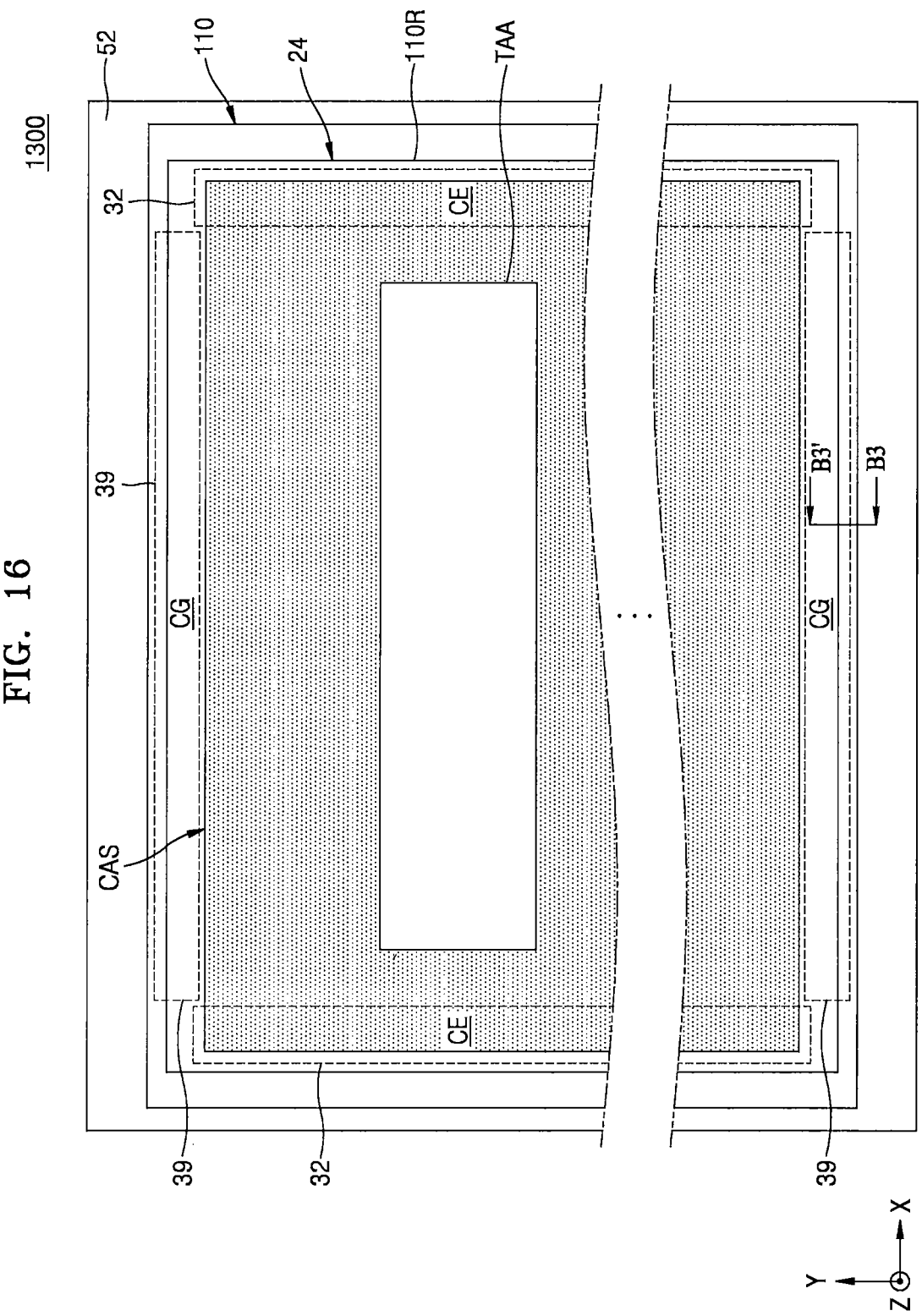
FIG. 16 is a schematic plan view of a planar arrangement of some components of an integrated circuit device according to embodiments of the inventive concepts.

FIG. 16 is a schematic plan view of a planar arrangement of some components of an integrated circuit device 1300 according to embodiments of the inventive concepts.

Referring to FIG. 16, the integrated circuit device 1300 may include substantially the same configuration as the integrated circuit device 1100 described with reference to FIG. 14. However, the conductive plate 110 may include a plurality of second edge-side conductive regions CG arranged on opposite sides of the tile region 110R in the second horizontal direction (e.g., the Y direction). The plurality of second edge-side conductive regions CG may be regions that do not vertically overlap the row decoder 32. The plurality of second edge-side conductive regions CG may extend to a position outside the tile region 110R of the conductive plate 110.

In the integrated circuit device 1300, the common source line driver 39 may be arranged in at least one position selected from among a plurality of positions that vertically overlap the plurality of second edge-side conductive regions CG included in the conductive plate 110.

In FIGS. 14, 15, and 16, it is illustrated that the common source line driver 39 is arranged in the positions that vertically overlap the plurality of first edge-side conductive regions CE, the plurality of interface conductive regions CF, or the plurality of second edge-side conductive regions CG, but according to the inventive concepts, the positions in which the common source line driver 39 may be arranged is not limited to those illustrated in FIGS. 14, 15, and 16. According to embodiments according to the inventive concepts, the common source line driver 39 may be arranged at at least one position selected from among a plurality of positions that vertically overlap the plurality of first conductive regions C1 and the plurality of second conductive regions C2 illustrated in FIG. 5A, a plurality of positions that vertically overlap the plurality of conductive regions C5 illustrated in FIG. 10A, a plurality of positions that vertically overlap the plurality of first edge-side conductive regions CE illustrated in FIG. 14, a plurality of positions that vertically overlap the plurality of interface regions CF illustrated in FIG. 15, and a plurality of positions that vertically overlap the plurality of second conductive regions CG.

Figure 17:
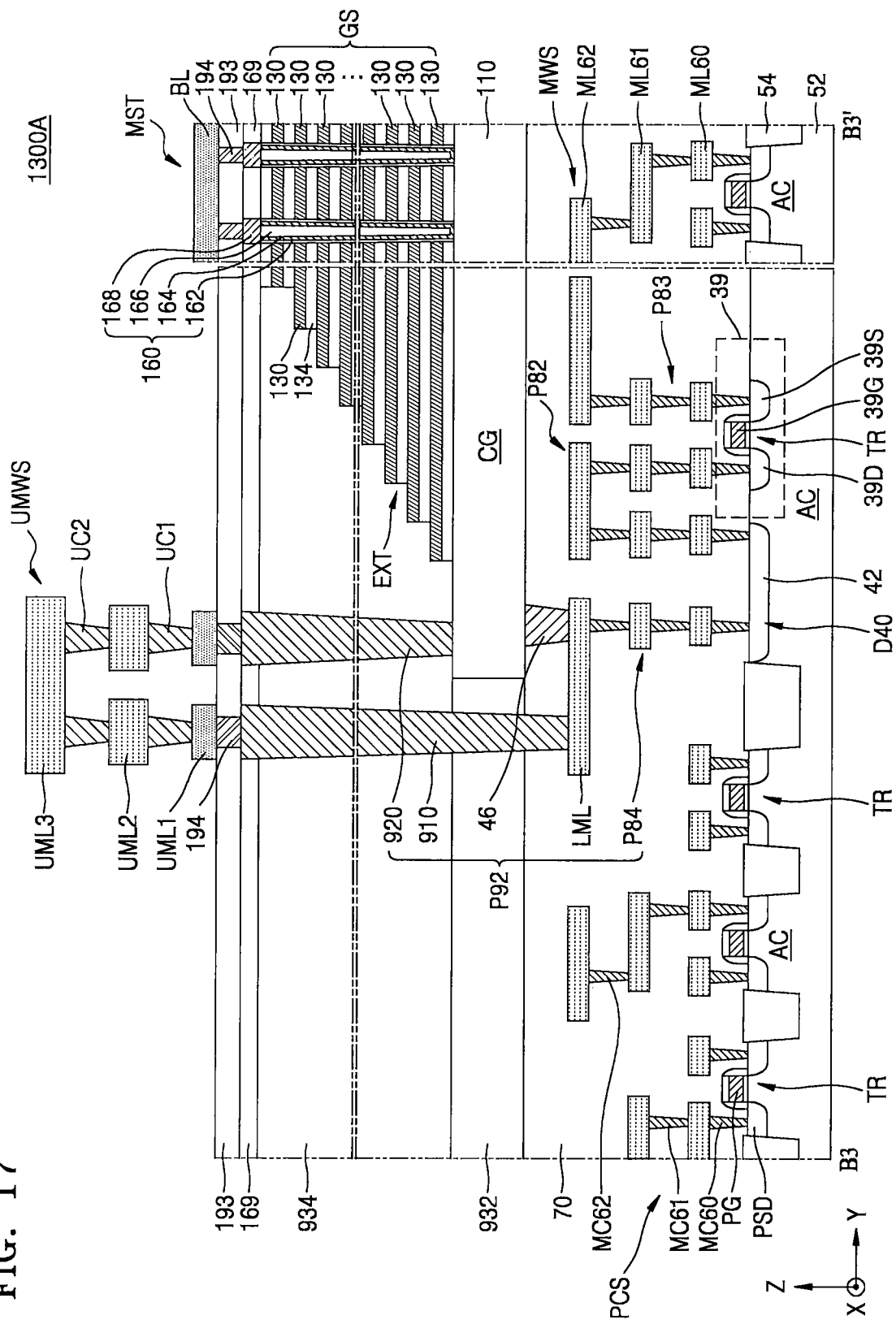
FIG. 17 is a cross-sectional view of an integrated circuit device according to another embodiment of the inventive concepts.

FIG. 17 is a cross-sectional view illustrating an integrated circuit device 1300A according to another embodiment of the inventive concepts. FIG. 17 is an enlarged cross-sectional view of a part of a region corresponding to a partial region of a cross-section taken along the line B3-B3' of FIG. 16.

Referring to FIG. 17, the integrated circuit device 1300A may include the common source line driver 39 that is arranged at a position vertically overlapping the second edge-side conductive region CG as illustrated in FIG. 16, and may include the arc protection diode D40 formed on the lower substrate 52 at a position adjacent to the common source line driver 39. The arc protection diode D40 may include the arc protection ion implantation region 42.

The arc protection ion implantation region 42 and the conductive plate 110 may be connected through the first wiring structure P92. The drain 39D of the common source line driver 39 may be horizontally spaced apart from the arc protection diode D40. The drain 39D of the common source line driver 39 may be connected to the arc protection ion implantation region 42 of the arc protection diode D40 through the second wiring structure P82.

The first wiring structure P92 may include a lower wiring pattern LML, an intermediate wiring structure P84, a driver through electrode 910, a bypass via contact 46, and a plate contact 920.

The lower wiring pattern LML may be arranged at a vertical level between the lower substrate 52 and the conductive plate 110. The intermediate wiring structure P84 may be connected between a bottom surface of the lower wiring pattern LML and the arc protection diode D40. The driver through electrode 910 may have a bottom surface that contacts a top surface of the lower wiring pattern LML and a top surface that is connected to upper wiring patterns UML1, UML2, and UML3 being at a vertical level higher than a vertical level of the plurality of channel structures 160, and may be longitudinally extended in the vertical direction (e.g., the Z direction). The bypass via contact 46 may be horizontally spaced apart from the driver through electrode 910 and may have a bottom surface that contacts the top surface of the lower wiring pattern LML and a top surface that contacts the bottom surface of the conductive plate 110. The plate contact 920 may be horizontally spaced apart from the driver through electrode 910 and may be configured to be connected to the driver through electrode 910 through upper wiring patterns UML1, UML2, and UML3. The plate contact 920 may have a bottom surface that contacts the conductive plate 110.

In the first wiring structure P92, the intermediate wiring structure P84 and the lower wiring pattern LML may be parts of the multilayer wiring structure MWS of the peripheral circuit structure PCS. The detailed configuration of the bypass via contact 46 and the intermediate wiring structure P84 is the same as that described with reference to FIG. 6. In example embodiments, either of the bypass via contact 46 and the plate contact 920 in the first wiring structure P92 may be omitted.

The integrated circuit device 1300A may include a first insulating layer 932 that covers the interlayer insulating layer 70 around the conductive plate 110 and a second insulating layer 934 that covers an extension part EXT of the plurality of gate lines 130 on the first insulating layer 932. A top surface of the second insulating layer 934 may be sequentially covered with the upper insulating layer 169 and the insulating layer 193.

The driver through electrode 910 may penetrate the upper insulating layer 169, the second insulating layer 934, the first insulating layer 932, and a portion of the interlayer insulating layer 70 to be connected to the top surface of the lower wiring pattern LML. The plate contact 920 may penetrate the upper insulating layer 169 and the second insulating layer 934 to be connected to the top surface of the conductive plate 110. The driver through electrode 910 and the plate contact 920 may be respectively connected to an upper wiring structure UMWS through a contact pad 194 among a plurality of contact pads 194. The upper wiring structure UMWS may include a plurality of first upper wiring patterns UML1, a plurality of second upper wiring patterns UML2, and a third upper wiring pattern UML3, which are at different vertical levels from each other. The upper wiring structure UMWS may further include a first upper contact UC1 connected between the first upper wiring pattern UML1 and the second upper wiring pattern UML2, and a second upper contact UC2 connected between the second upper wiring pattern UML2 and the third upper wiring pattern UML3. In example embodiments, the plurality of first upper wiring patterns UML1 may be arranged at the same vertical level as the bit line BL. The driver through electrode 910 and the plate contact 920 may be configured to be interconnected through the plurality of contact pads 194 and the upper wiring structure UMWS.

The driver through electrode 910 and the plate contact 920 may include, for example, at least one metal selected from among W, gold (Au), silver (Ag), copper (Cu), aluminum (Al), titanium aluminum nitride (TiAlN), tungsten nitride (WN), iridium (Ir), platinum (Pt), palladium (Pd), ruthenium (Ru), zirconium (Zr), rhodium (Rh), Ni, Co, chromium (Cr), tin (Sn), and zinc (Zn). In example embodiments, the driver through electrode 910 and the plate contact 920 may include a metal layer including W and a conductive barrier layer surrounding the metal layer. The conductive barrier layer may include, for example, Ti, TiN, Ta, TaN, or combinations thereof.

The upper wiring structure UMWS may include, for example, metal, conductive metal nitride, metal silicide, or combinations thereof. In example embodiments, the upper wiring structure UMWS may include W, Al, Cu, molybdenum (Mo), Ti, Co, Ta, Ni, tungsten silicide, titanium silicide, cobalt silicide, tantalum silicide, nickel silicide, or combinations thereof. For example, the upper wiring structure UMWS may include a metal pattern including W, Al, or Cu, and a conductive barrier layer surrounding the metal pattern. The conductive barrier layer may include Ti, TiN, Ta, TaN, or combinations thereof. The upper wiring structure UMWS may be covered with an insulating layer (not shown).

Figure 18:
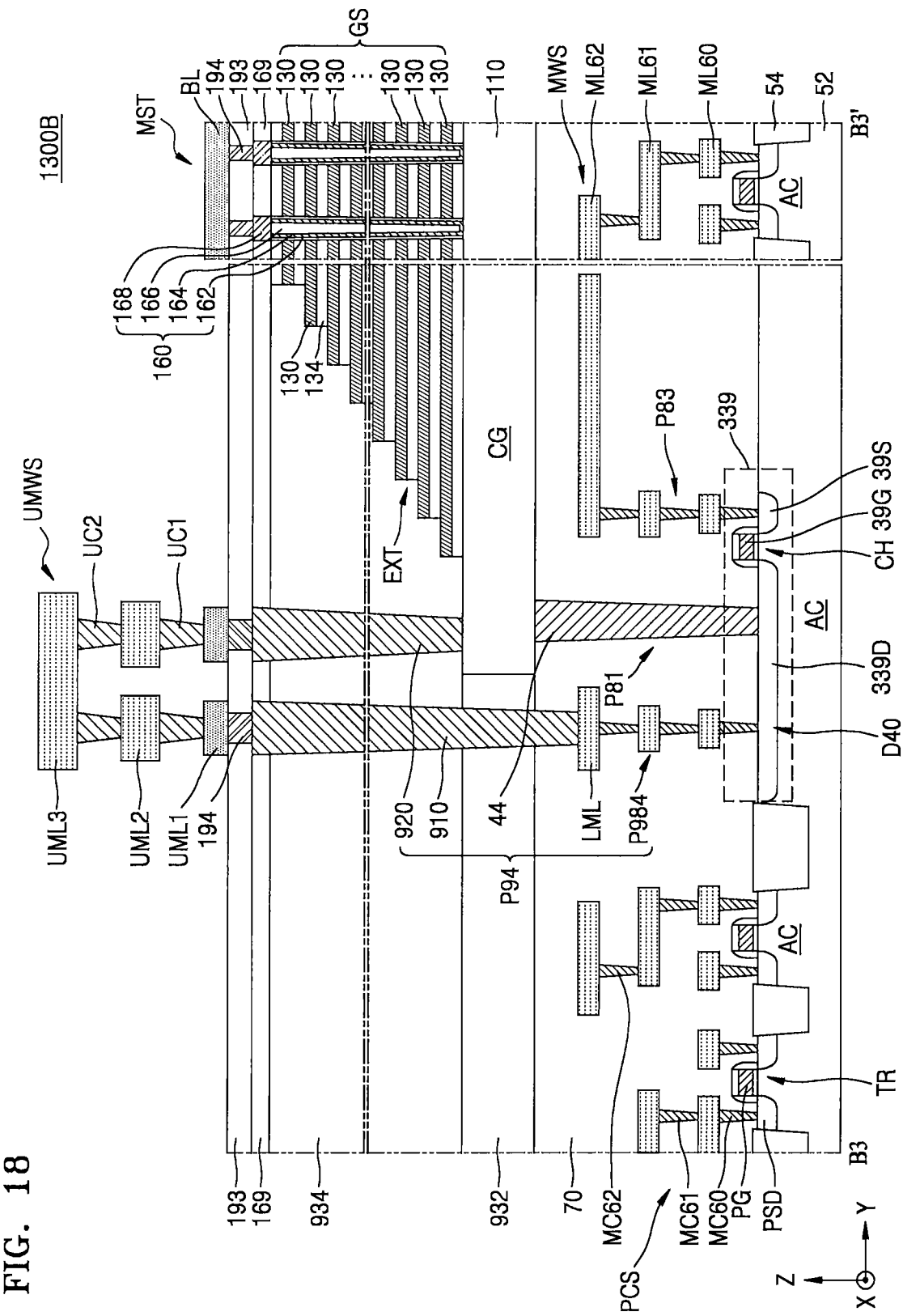
FIG. 18 is a cross-sectional view of an integrated circuit device according to another embodiment of the inventive concepts.

FIG. 18 is a cross-sectional view illustrating an integrated circuit device 1300B according to another embodiment of the inventive concepts. FIG. 18 is an enlarged cross-sectional view of a part of a region corresponding to a partial region of a cross-section taken along the line B3-B3' of FIG. 16.

Referring to FIG. 18, the integrated circuit device 1300B may include substantially the same configuration as the integrated circuit device 1300A described with reference to FIG. 17. However, the integrated circuit device 1300B may include the common source line driver 339 arranged at a position that vertically overlaps the second edge-side conductive region CG, as illustrated in FIG. 16. The arc protection diode D40 may be integrally connected to and/or integrated with the drain 339D of the common source line driver 339. The arc protection diode D40 integrally connected to and/or integrated with the drain 339D of the common source line driver 339 may be connected to the conductive plate 110 through the first wiring structure P94.

The first wiring structure P94 may include the lower wiring pattern LML, an intermediate wiring structure P984, the driver through electrode 910, a bypass via contact 44, and the plate contact 920.

The lower wiring pattern LML may be arranged at a vertical level between the lower substrate 52 and the conductive plate 110. The intermediate wiring structure P984 may be connected between the bottom surface of the lower wiring pattern LML and the arc protection diode D40. The driver through electrode 910 may have the bottom surface that contacts the top surface of the lower wiring pattern LML and the top surface connected to the upper wiring patterns UML1, UML2, and UML3 and may be longitudinally extended in the vertical direction (e.g., the Z direction). The bypass via contact 44 may be horizontally spaced apart from the driver through electrode 910 and may have a bottom surface connected to the arc protection diode D40 and a top surface contacting the bottom surface of the conductive plate 110. The plate contact 920 may be horizontally spaced apart from the driver through electrode 910 and may be configured to be connected to the driver through electrode 910 through upper wiring patterns UML1, UML2, and UML3. The plate contact 920 may have the bottom surface that contacts the conductive plate 110.

In the first wiring structure P94, the intermediate wiring structure P984 and the lower wiring pattern LML may be parts of the multilayer wiring structure MWS of the peripheral circuit structure PCS. The detailed configuration of the bypass via contact 44 is the same as that described with reference to FIG. 5B. The detailed configuration of the intermediate wiring structure P984 is the same as that described with respect to the intermediate wiring structure P84 with reference to FIG. 6. In example embodiments, either of the bypass via contact 44 and the plate contact 920 in the first wiring structure P94 may be omitted.

Next, a method of manufacturing an integrated circuit device according to embodiments of the inventive concepts will be described in detail.

FIGS. 19A to 19F are cross-sectional views for describing a method of manufacturing an integrated circuit device according to embodiments of the inventive concepts. FIGS. 19A to 19F illustrate cross-sectional views corresponding to some components taken along the line B1-B1$^1$ of FIG. 5A, in the process order. Referring to FIGS. 19A to 19F, an example method of manufacturing the integrated circuit device 100 described with reference to FIGS. 5A and 5B will be described.

Figure 19A:
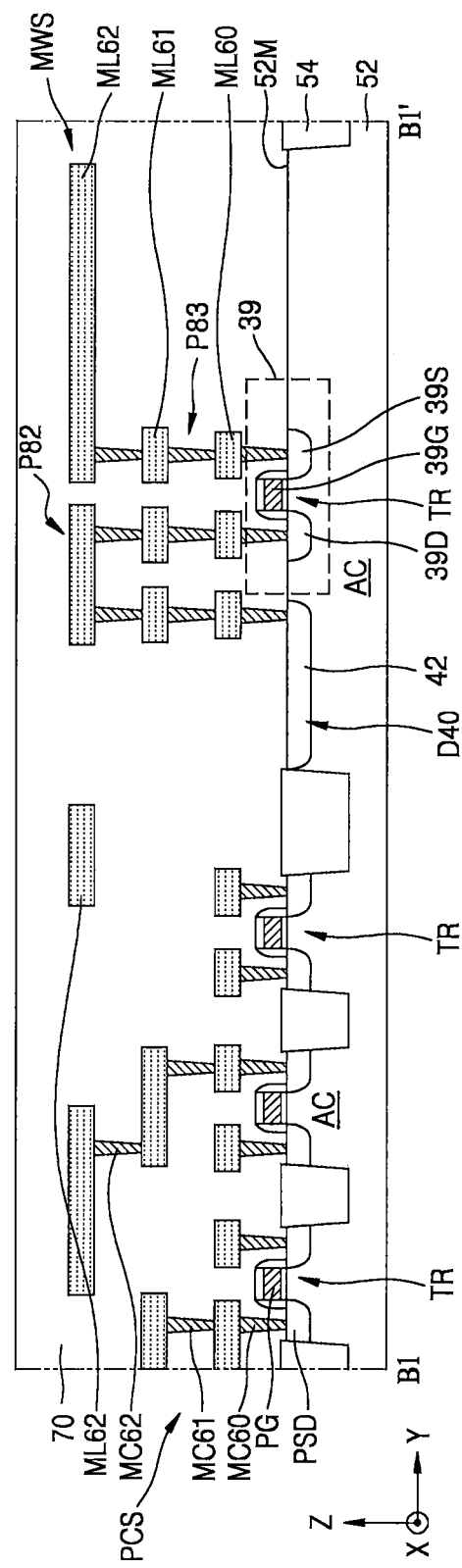
FIGS. 19A to 19F are cross-sectional views for describing a method of manufacturing an integrated circuit device according to embodiments of the inventive concepts.

Referring to FIG. 19A, the peripheral circuit structure PCS including the substrate 52, the plurality of transistors TR, the multilayer wiring structure MWS, and the interlayer insulating layer 70 may be formed. The peripheral circuit structure PCS may include the common source line driver 39 and the arc protection ion implantation region 42 of the arc protection diode D40. The drain 39D of the common source line driver 39 may be horizontally spaced apart from the arc protection ion implantation region 42, and the drain 39D of the common source line driver 39 may be connected to the arc protection ion implantation region 42 via the second wiring structure P82.

Figure 19B:
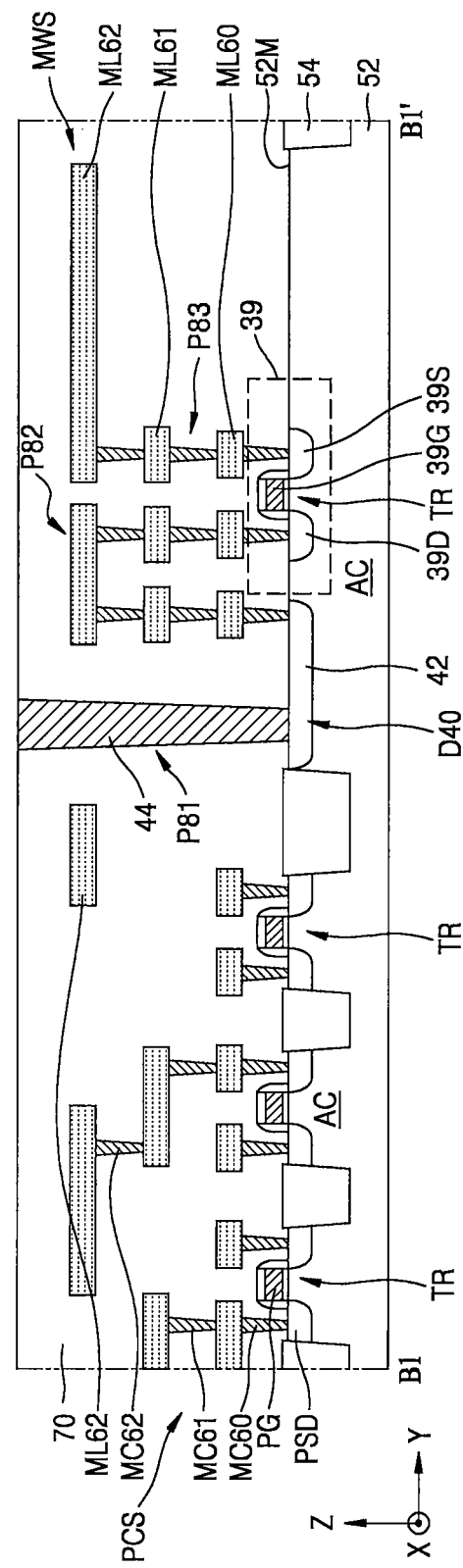

Referring to FIG. 19B, the bypass via contact 44 penetrating the interlayer insulating layer 70 and extending to the arc protection ion implantation region 42 of the arc protection diode D40 may be formed. The bypass via contact 44 may constitute the first wiring structure P81.

Figure 19C:
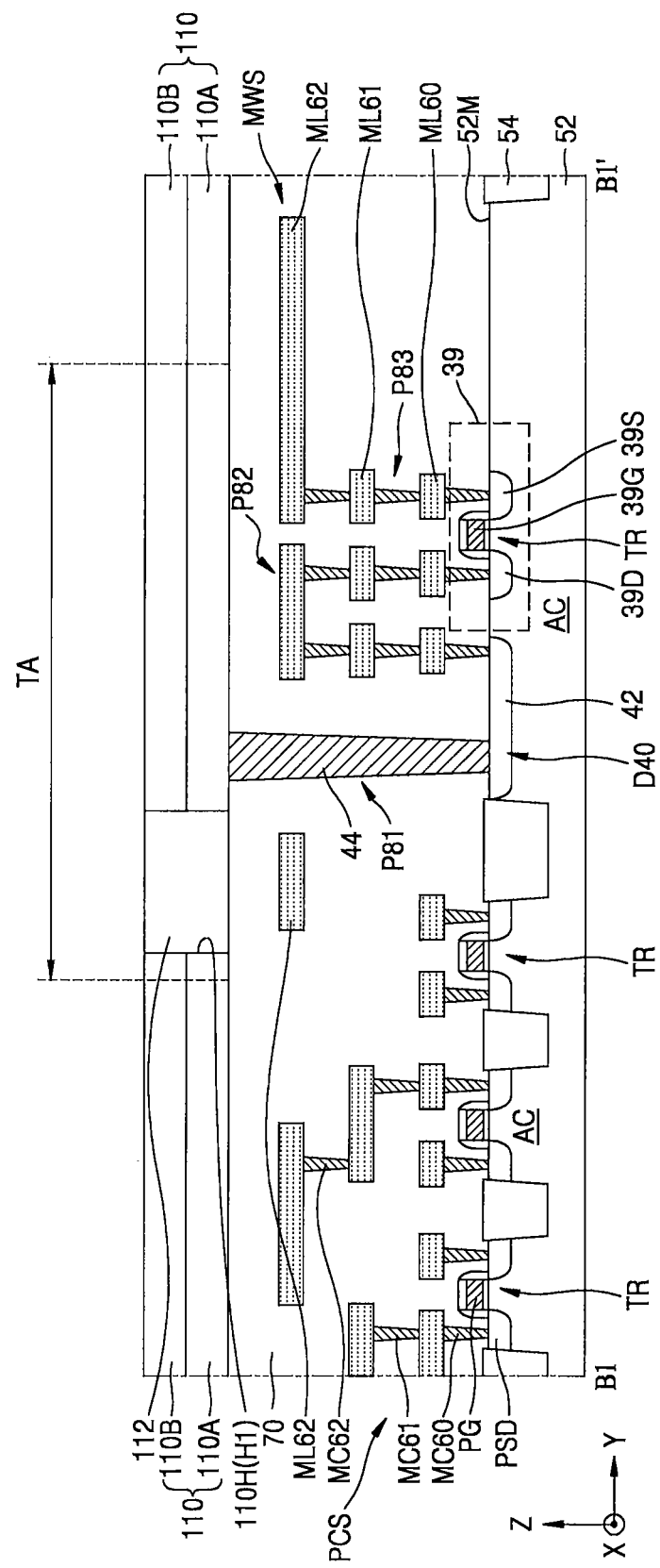

Referring to FIG. 19C, the conductive plate 110 may be formed by sequentially forming the metal plate 110A and the semiconductor plate 110B on the peripheral circuit structure PCS and the bypass via contact 44, the plurality of through holes 110H in the through electrode region TA of the conductive plate 110 may be formed, and then the buried insulating layer 112 filling the plurality of through holes 110H may be formed.

Figure 19D:
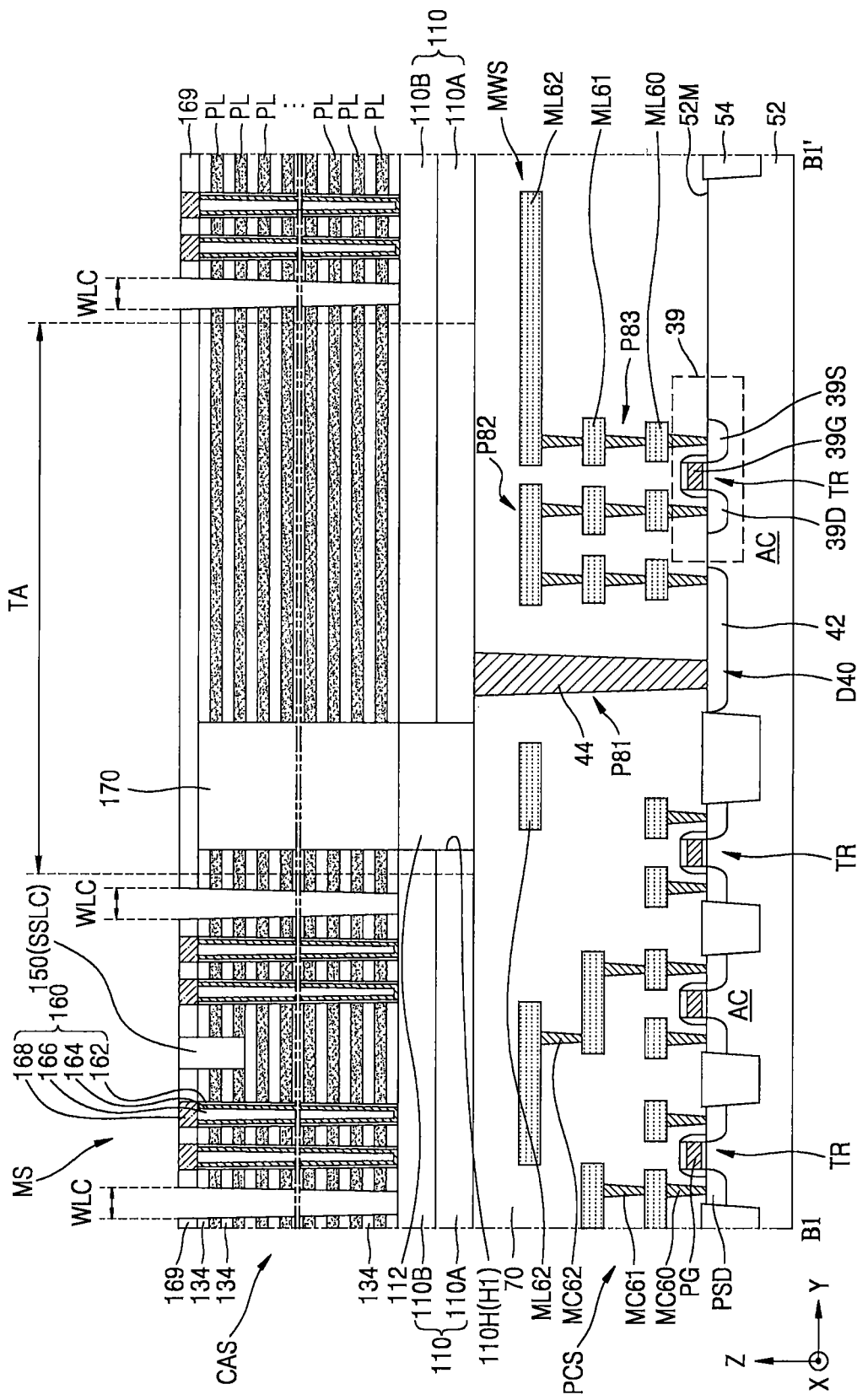

Referring to FIG. 19D, on the conductive plate 110 and the buried insulating layer 112, the plurality of insulating layers 134 and the plurality of sacrificial layers PL may be alternately stacked one by one. The plurality of sacrificial layers PL may include, for example, silicon nitride, silicon carbide, or polysilicon. The plurality of sacrificial layers PL may respectively function to secure spaces for forming the plurality of gate lines 130 in a subsequent process.

Then, parts of the plurality of insulating layers 134 and the plurality of sacrificial layers PL may be replaced by the insulating structure 170 and then the upper insulating layer 169 may be formed. The upper insulating layer 169 may be on and/or cover the uppermost insulating layer 134 among the plurality of insulating layers 134 and the insulating structure 170. Thereafter, the plurality of channel structures 160 that penetrate the upper insulating layer 169, the plurality of insulating layers 134, and the plurality of sacrificial layers PL may be formed, the string selection line cut regions SSLC may then be formed, and then the insulating layers 150 filling the string selection line cut regions SSLC may be formed.

Thereafter, the plurality of word line cut regions WLC that penetrate the upper insulating layer 169, the plurality of insulating layers 134, and the plurality of sacrificial layers PL may be formed. Through the plurality of word line cut regions WLC, the top surface of the conductive plate 110 may be exposed.

Figure 19E:
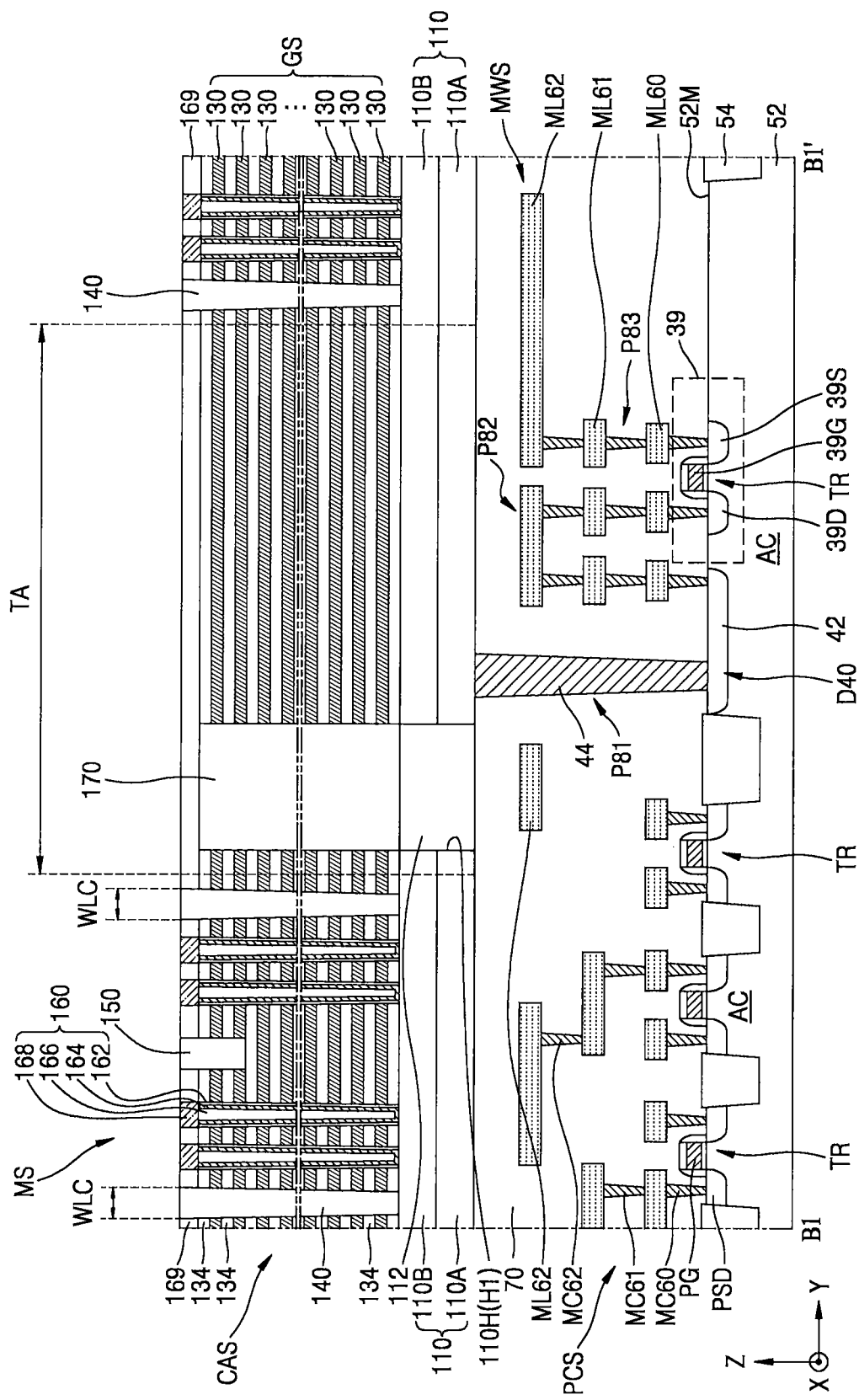

Referring to FIG. 19E, in the resultant structure of FIG. 19D, the plurality of sacrificial layers PL may be replaced with the plurality of gate lines 130 via the plurality of word line cut regions WLC. In some embodiments, in order to replace the plurality of sacrificial layers PL (refer to FIG. 19D) with the plurality of gate lines 130, the plurality of sacrificial layers PL that are exposed through the plurality of word line cut regions WLC may be selectively removed to provide empty spaces between the plurality of insulating layers 134 and then the plurality of gate lines 130 may be formed by filling a conductive material in the empty spaces. Thereafter, insulating layers 140 filling the plurality of word line cut regions WLC may be formed.

Figure 19F:
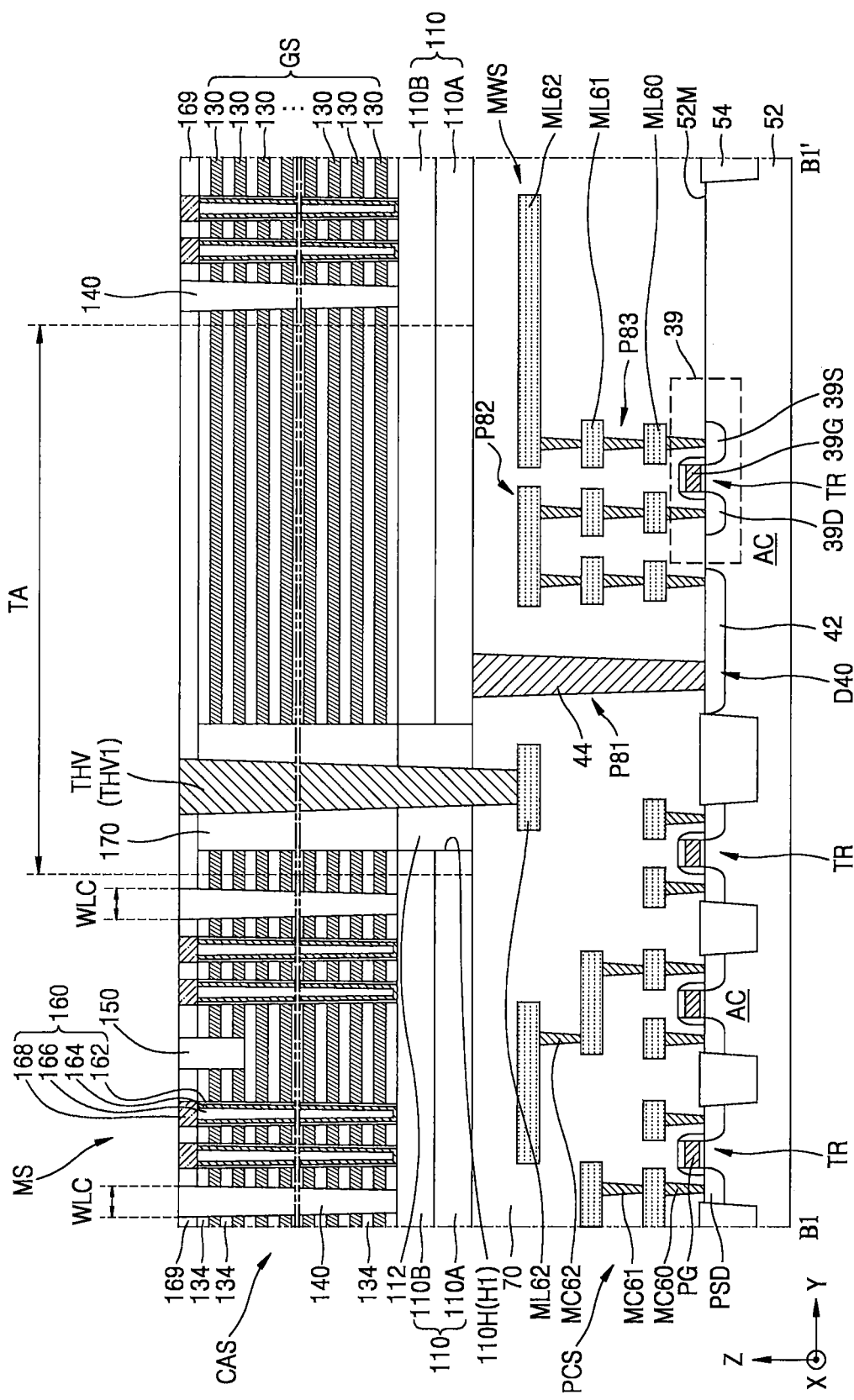

Referring to FIG. 19F, the through electrode THV (refer to FIG. 7) may be formed to contact the top surface of the peripheral circuit wiring layer ML62, while penetrating the upper insulating layer 169, the insulating structure 170, the buried insulating layer 112, and the interlayer insulating layer 70. The peripheral circuit wiring layer ML62 that contacts the through electrode THV may be connected to the page buffer 34 (refer to FIG. 1) among the plurality of circuits formed in the peripheral circuit structure PCS.

Thereafter, as illustrated in FIG. 5B, the insulating layer 193 that is on and/or covers a top surface of the resultant structure in which the plurality of through electrodes THV are formed may be formed, and then the plurality of contact pads 194 and the contact pad 195 that respectively penetrate the insulating layer 193 may be formed, in which the plurality of contact pads 194 may be connected to the drain regions 168 of the plurality of channel structures 160 and the contact pad 195 may be connected to the through electrode THV. Thereafter, the bit line BL may be formed on the plurality of contact pads 194 and contact pad 195 to manufacture the integrated circuit device 100 illustrated in FIGS. 5A and 5B. The bit line BL may be connected to the plurality of channel structures 160 and the through electrode THV via the plurality of contact pads 194 and contact pad 195, respectively.

The manufacturing method of the integrated circuit device 100 illustrated in FIGS. 5A and 5B has been described herein with reference to FIGS. 19A to 19F, but those skilled in the art will appreciate that various integrated circuit devices, including the integrated circuit device 200 illustrated in FIG. 6, the integrated circuit device 300 illustrated in FIGS. 7 and 8, the integrated circuit device 400 illustrated in FIG. 9, the integrated circuit device 500 illustrated in FIGS. 10A and 10B, the integrated circuit device 600 illustrated in FIG. 11, the integrated circuit device 700 illustrated in FIG. 12, the integrated circuit device 800 illustrated in FIG. 13, the integrated circuit device 1100 illustrated in FIG. 14, the integrated circuit device 1200 illustrated in FIG. 15, the integrated circuit devices 1300, 1300A, and 1300B illustrated in FIGS. 16 to 18, and integrated circuit devices having similar structures thereof, may be manufactured as described with reference to FIGS. 19A to 19F within the scope of the inventive concepts.

Figure 20:
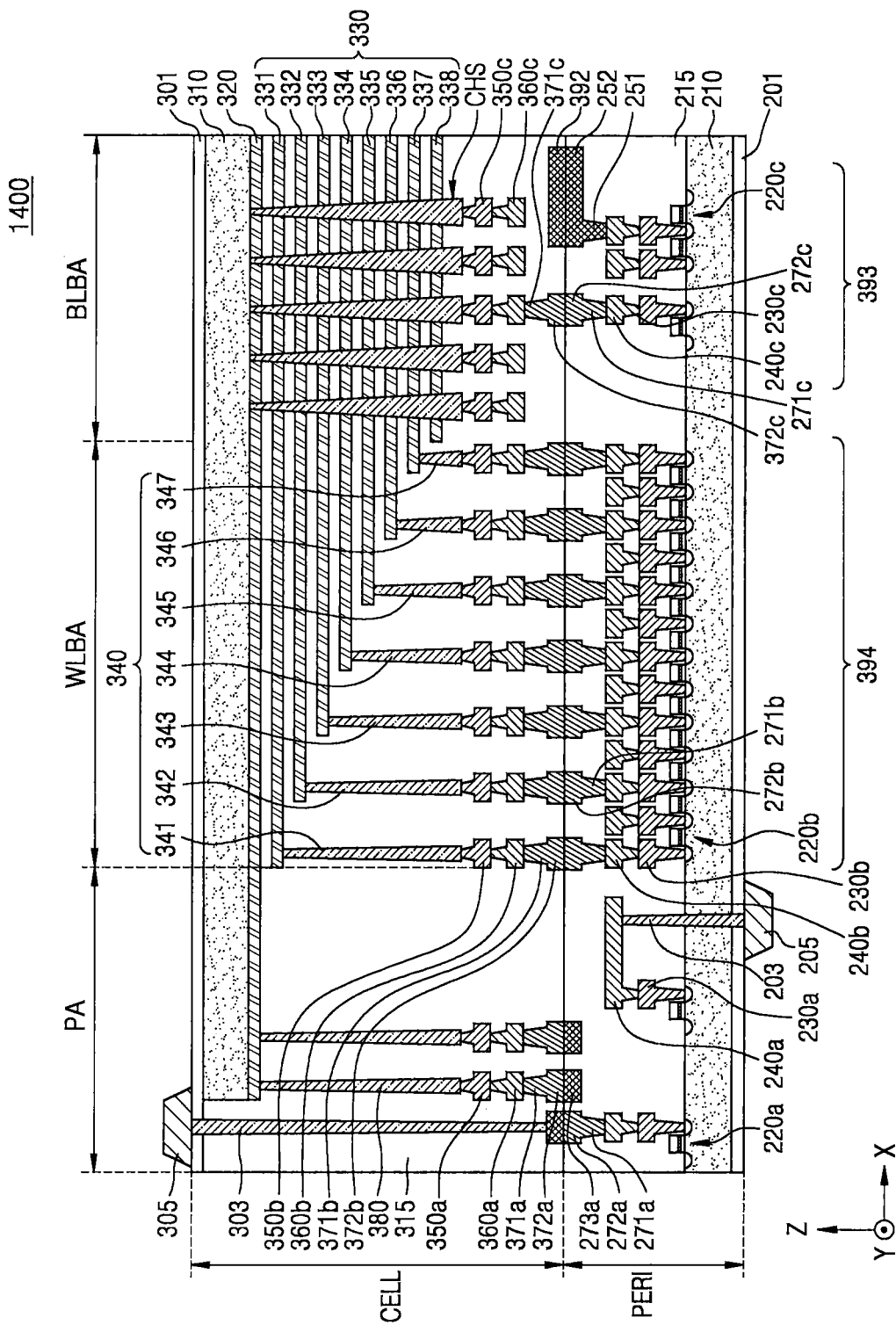
FIG. 20 is a cross-sectional view of a memory device according to embodiments of the inventive concepts.

FIG. 20 is a cross-sectional view of an integrated circuit device 1400 according to embodiments of the inventive concepts.

Referring to FIG. 20, the integrated circuit device 1400 may have a chip to chip (C2C) structure. The same reference numerals are used to denote the same elements throughout the drawings, repeated descriptions thereof will be omitted. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the integrated circuit device 1400 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high resistance, and the second metal layers 240a, 240b, and 240c may be formed of copper having relatively low resistance.

In an example embodiment illustrate in FIG. 20, although the first metal layers 230a, 230b, and 230c and the second metal layers 240a, 240b, and 240c are shown and described, they are not limited thereto, and one or more metal layers may be further formed on the second metal layers 240a, 240b, and 240c. At least a portion of the one or more metal layers formed on the second metal layers 240a, 240b, and 240c may be formed of aluminum or the like having a lower resistance than those of copper forming the second metal layers 240a, 240b, and 240c.

The interlayer insulating layer 215 may be disposed on the first substrate 210 and may be on and/or cover the plurality of circuit elements 220a, 220b, and 220c, the first metal layers 230a, 230b, and 230c, and the second metal layers 240a, 240b, and 240c. The interlayer insulating layer 215 may include, for example, an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to upper bonding metals 371b and 372b in the cell region CELL in a bonding manner, and the lower bonding metals 271b and 272b and the upper bonding metals 371b and 372b may be formed, for example, of aluminum, copper, tungsten, or the like. Further, the lower bonding metals 271b and 272b in the peripheral circuit region PERI may be referred as first metal pads and the upper bonding metals 371b and 372b in the cell region CELL may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (e.g., a Z-axis direction) perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line. The plurality of word lines 330, the least one string select line, and the at least one ground select line may correspond to the plurality of gate lines 130 described with reference to FIG. 5B.

In the bit line bonding area BLBA, a channel structure CHS may extend in a direction (e.g., the Z direction) perpendicular to the upper surface of the second substrate 310, and pass through the plurality of word lines 330, the at least one string select line, and the at least one ground select line. The channel structure CHS may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (e.g., a Y-axis direction), parallel to the upper surface of the second substrate 310.

In an example embodiment illustrated in FIG. 20, an area in which the channel structure CHS, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (e.g., an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed in the external pad bonding area PA. The common source line contact plug 380 may be formed, for example, of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 20, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 20, an upper insulating film 301 covering the upper surface of the second substrate 310 may be formed on the second substrate 310, and a second input-output pad 305 may be disposed on the upper insulating film 301. The second input-output pad 305 may be connected to at least one of the plurality of circuit elements 220a, 220b, and 220c disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (e.g., the Z-axis direction). Referring to FIG. 20, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the integrated circuit device 1400 may include only the first input-output pad 205 disposed on the first substrate 210 or the second input-output pad 305 disposed on the second substrate 310. Alternatively, the integrated circuit device 1400 may include both the first input-output pad 205 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the integrated circuit device 1400 may include lower metal patterns 271a, 272a, and 273a, corresponding to upper metal patterns 371a and 372a formed in an uppermost metal layer of the cell region CELL, and having the same shape as the upper metal patterns 371a and 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL. In an example embodiment, the peripheral circuit region PERI may include the peripheral circuit structure PCS described with reference to FIGS. 5B, 6, 7, 9, 10B, 11, 12, 13, 17, and 18. In an example embodiment, the cell region CELL may include the cell array structure CAS described with reference to FIGS. 5B, 6, 7, 9, 10B, 14, 15, and 16. In an example embodiment, the peripheral circuit region PERI may include an arc protection diode having the same configuration as one arc protection diode D40 described with reference anyone of FIGS. 5B, 6, 7, 9, 10B, 11, 12, 13, 17, and 18. The arc protection diode included in the peripheral circuit region PERI may be connected through the lower bonding metals 271c and 272c and the upper bonding metals 371c and 372c to a conductive layer (e.g., the common source line 320 and/or the second substrate 310) included in the cell region CELL.

While the inventive concepts have been particularly shown and described with reference to embodiments thereof, it will be understood that various changes in form and details may be made therein without departing from the scope of the following claims.

What is claimed is:

1. An integrated circuit device comprising:
a peripheral circuit structure comprising a lower substrate, an arc protection diode in the lower substrate, and a common source line driver connected to the arc protection diode;
a conductive plate on the peripheral circuit structure;
a cell array structure overlapping the peripheral circuit structure in a vertical direction with the conductive plate therebetween; and
a first wiring structure connected between the arc protection diode and the conductive plate, wherein the common source line driver comprises:
a gate on the lower substrate;
a drain in the lower substrate at a position adjacent the gate and integrated with the arc protection diode; and
a source in the lower substrate on an opposite side of the gate from the drain, and wherein a first planar area of the drain is greater than a second planar area of the source.

2. The integrated circuit device of claim 1, wherein the first wiring structure comprises a bypass via contact having a top surface and a bottom surface,
wherein the top surface of the bypass via contact contacts a bottom surface of the conductive plate, and
wherein the bottom surface of the bypass via contact contacts the arc protection diode.

3. The integrated circuit device of claim 1, wherein the first wiring structure comprises:
a bypass via contact having a top surface and a bottom surface; and
an intermediate wiring structure connected between the bottom surface of the bypass via contact and the arc protection diode,
wherein the top surface of the bypass via contact contacts a bottom surface of the conductive plate, and
wherein the bottom surface of the bypass via contact is spaced apart from the arc protection diode in the vertical direction.

4. An integrated circuit device comprising:
a peripheral circuit structure comprising a lower substrate, an arc protection diode in the lower substrate, and a common source line driver that comprises a transistor connected to the arc protection diode;
a cell array structure that overlaps the peripheral circuit structure in a vertical direction and comprises a memory stack comprising a plurality of gate lines stacked in the vertical direction and a channel structure penetrating the plurality of gate lines in the vertical direction;
a conductive plate between the peripheral circuit structure and the cell array structure; and
a first wiring structure connected between the arc protection diode and the conductive plate,
wherein the transistor of the common source line driver comprises:
a gate on the lower substrate;
a source in the lower substrate at a position adjacent a first side of the gate; and
a drain in the lower substrate at a position adjacent a second side of the gate and integrated with the arc protection diode,
wherein a first planar area of the drain is greater than a second planar area of the source.

5. The integrated circuit device of claim 4, wherein the conductive plate is configured to transfer a common source voltage to the memory stack.

6. The integrated circuit device of claim 4, wherein the first wiring structure longitudinally extends in the vertical direction between the lower substrate and the conductive plate, and
wherein the first wiring structure comprises a bypass via contact having a top surface that contacts a bottom surface of the conductive plate and a bottom surface that contacts the arc protection diode.

7. The integrated circuit device of claim 4, wherein the first wiring structure comprises:

a bypass via contact that is between the lower substrate and the conductive plate and has a top surface that contacts a bottom surface of the conductive plate; and
an intermediate wiring structure that is connected between a bottom surface of the bypass via contact and the arc protection diode.

8. The integrated circuit device of claim 4, wherein the first wiring structure comprises:
a lower wiring pattern at a first vertical level between the lower substrate and the conductive plate;
an intermediate wiring structure connected between a bottom surface of the lower wiring pattern and the arc protection diode;
a driver through electrode that longitudinally extends in the vertical direction and has a top surface and a bottom surface, wherein the bottom surface of the driver through electrode contacts a top surface of the lower wiring pattern, and wherein the top surface of the driver through electrode is connected to an upper wiring pattern at a second vertical level that is higher than a third vertical level of the channel structure;
a bypass via contact that is spaced apart from the driver through electrode in a horizontal direction, the bypass via contact having a bottom surface that contacts the top surface of the lower wiring pattern and a top surface that contacts a bottom surface of the conductive plate; and
a plate contact that is spaced apart from the driver through electrode in the horizontal direction and connected to the driver through electrode via the upper wiring pattern, the plate contact having a bottom surface that contacts the conductive plate.

9. The integrated circuit device of claim 4, wherein the first wiring structure comprises:
a lower wiring pattern at a first vertical level between the lower substrate and the conductive plate;
an intermediate wiring structure connected between a bottom surface of the lower wiring pattern and the arc protection diode;
a driver through electrode that longitudinally extends in the vertical direction and has a top surface and a bottom surface, wherein the bottom surface of the driver through electrode contacts a top surface of the lower wiring pattern, and wherein the top surface of the driver through electrode is connected to an upper wiring pattern at a second vertical level that is higher than a third vertical level of the channel structure;
a bypass via contact that is spaced apart from the driver through electrode in a horizontal direction, the bypass via contact having a bottom surface that is connected to the arc protection diode and a top surface that contacts a bottom surface of the conductive plate; and
a plate contact that is spaced apart from the driver through electrode in the horizontal direction and connected to the driver through electrode via the upper wiring pattern, the plate contact having a bottom surface that contacts the conductive plate.

10. The integrated circuit device of claim 4, wherein the source and the drain are spaced apart from each other in a channel length direction with a channel region therebetween, and the gate is on the channel region,
and
wherein a length of the drain is greater than a length of the source in the channel length direction.

11. The integrated circuit device of claim 4, further comprising:

a bit line that is spaced apart from the conductive plate with the cell array structure therebetween; and a bit line through electrode connected to the bit line and extending to the peripheral circuit structure while penetrating the cell array structure and the conductive plate, wherein the common source line driver vertically overlaps a conductive region of the conductive plate in a region adjacent to the bit line through electrode.

12. The integrated circuit device of claim 4, wherein the peripheral circuit structure further comprises a row decoder, and wherein the conductive plate comprises:

a tile region;

a through electrode region in the tile region;

a plurality of first edge-side conductive regions in opposite edge portions of the tile region in a first horizontal direction, wherein at least one of the plurality of first edge-side conductive regions vertically overlaps the row decoder;

a plurality of interface conductive regions between the plurality of first edge-side conductive regions and the through electrode region; and a plurality of second edge-side conductive regions in opposite edge portions of the tile region in a second horizontal direction perpendicular to the first horizontal direction, wherein the plurality of second edge-side conductive regions do not vertically overlap the row decoder, wherein the common source line driver vertically overlaps the plurality of first edge-side conductive regions, the plurality of interface conductive regions, and/or the plurality of second edge-side conductive regions.

13. An integrated circuit device comprising:

a peripheral circuit region comprising a peripheral circuit structure, wherein the peripheral circuit structure comprises a lower substrate, an arc protection diode in the lower substrate, and a common source line driver connected to the arc protection diode;

a cell region comprising a cell array structure overlapping the peripheral circuit structure in a vertical direction, wherein the cell region is vertically connected to the peripheral circuit region; and a conductive plate comprising a conductive region, wherein the conductive plate is between the peripheral circuit structure and the cell array structure, wherein the common source line driver comprises a transistor that comprises a gate, a source in the lower substrate adjacent a first side of the gate, and a drain in the lower substrate adjacent a second side of the gate and connected to the arc protection diode, wherein the cell array structure comprises a plurality of gate lines stacked in the vertical direction on the conductive plate and a channel structure penetrating the plurality of gate lines in the vertical direction, wherein the peripheral circuit structure further comprises a first wiring structure connected between the arc protection diode and the conductive plate, wherein the drain of the transistor is integrated with the arc protection diode, and wherein a length of the drain is greater than a length of the source in a channel length direction of the transistor.

* * * * *